(12) United States Patent  (10) Patent No.: US 7,846,625 B2
Kawashima  (45) Date of Patent: Dec. 7, 2010

(54) PHASE SHIFT MASK

(75) Inventor: Miyoko Kawashima, Haga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 12/172,880

(22) Filed: Jul. 14, 2008

(65) Prior Publication Data
US 2009/0023081 A1 Jan. 22, 2009

(30) Foreign Application Priority Data
Jul. 19, 2007 (JP) ............... 2007-188663

(51) Int. Cl.
G03C 5/00 (2006.01)
G03F 1/00 (2006.01)
(52) U.S. Cl. .......................... 430/30; 430/5
(58) Field of Classification Search .......... 430/5, 430/30; 356/364, 369, 371
See application file for complete search history.

(56) References Cited

U.S. PATENT DOCUMENTS

| 5,851,708 | A | 12/1998 | Lee et al. |
| 6,534,223 | B1 | 3/2003 | Yang |
| 2002/0025480 | A1 | 2/2002 | Itoh |
| 2002/0027719 | A1 | 3/2002 | Kreuzer |
| 2004/0029021 | A1 | 2/2004 | Garza |
| 2004/0119954 | A1 | 6/2004 | Kawashima |
| 2005/0136334 | A1 | 6/2005 | Dierichs |
| 2006/0012764 | A1 | 1/2006 | Kawashima |
| 2006/0139611 | A1 | 6/2006 | Wagner |
| 2006/0147814 | A1 | 7/2006 | Liang |
| 2006/0158629 | A1 | 7/2006 | Kawashima |
| 2006/0183033 | A1 | 8/2006 | Misaka |
| 2007/0046921 | A1* | 3/2007 | Takahashi et al. ............. 355/71 |

FOREIGN PATENT DOCUMENTS

| EP | 1361478 A1 | 11/2003 |
| JP | 57-104934 A | 6/1982 |
| JP | 05-109601 A | 4/1993 |
| JP | 2005-182031 A | 7/2005 |
| JP | 2005-321641 A | 11/2005 |
| JP | 2005-345960 A | 12/2005 |
| JP | 2006-135346 A | 5/2006 |
| JP | 2007-035671 A | 2/2007 |
| JP | 2007-141949 A | 6/2007 |
| KR | 10-0157928 B1 | 12/1998 |
| WO | 01/25855 A1 | 4/2001 |

OTHER PUBLICATIONS

IEEE Transaction on Electron Devices, vol. ED-29, No. 12, Dec. 1982, pp. 1828-1836.

* cited by examiner

Primary Examiner—Stephen Rosasco
(74) Attorney, Agent, or Firm—Canon U.S.A., Inc. I.P. Division

(57) ABSTRACT

A phase shift mask includes a substrate including first and second transmissive regions alternately disposed, and absorbers disposed on a surface of the substrate such that each absorber is sandwiched between the first and second transmissive regions. A phase shifter is defined by a difference between a surface height of the first transmissive region and a surface height of the second transmissive region. At least the first transmissive region among the first and second transmissive regions has a trench. An aperture portion formed between opposite side walls of respective adjacent absorbers has a width that increases along a depth direction of the substrate. Each trench has a width that increases along the depth direction of the substrate.

9 Claims, 31 Drawing Sheets

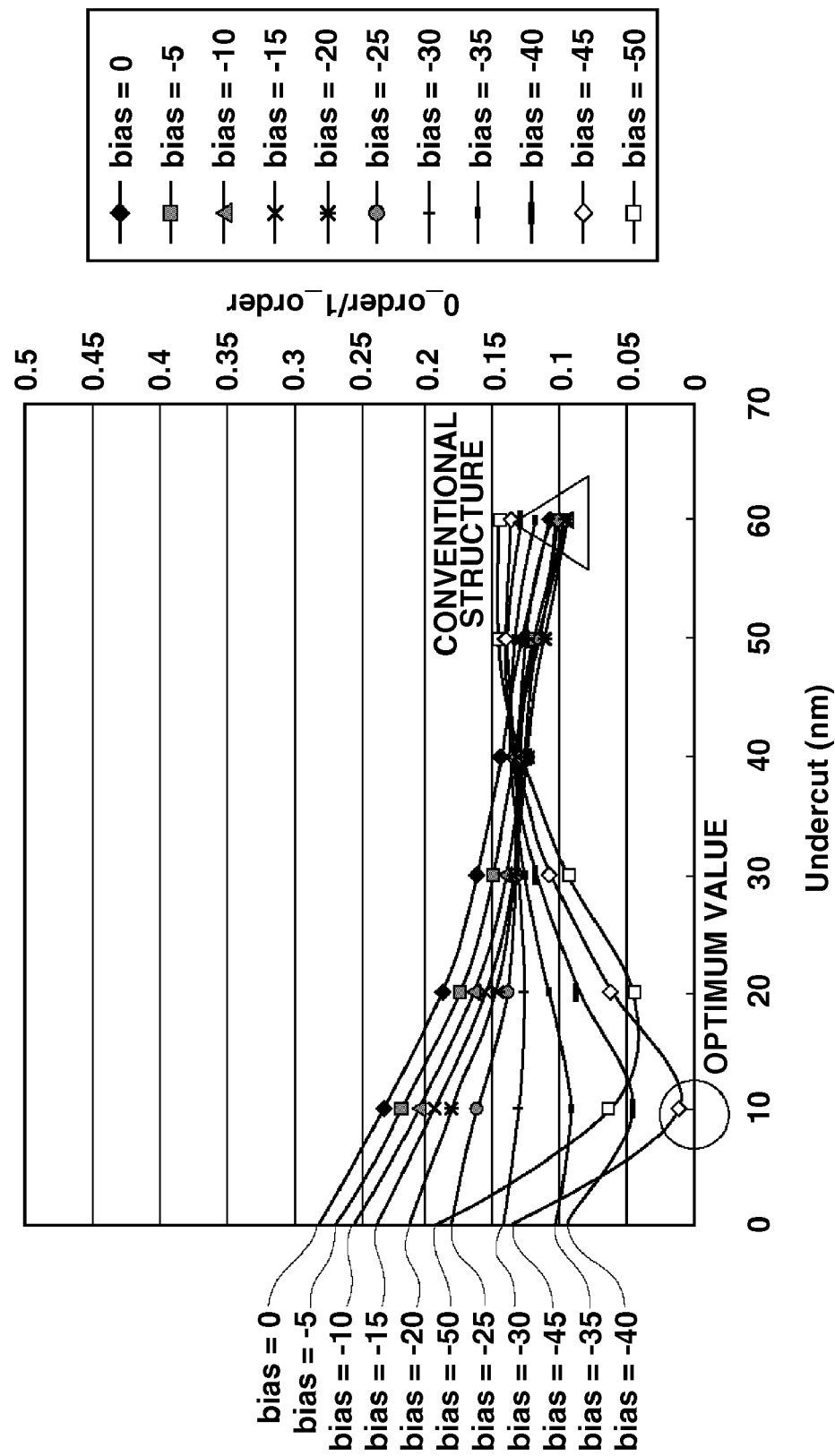

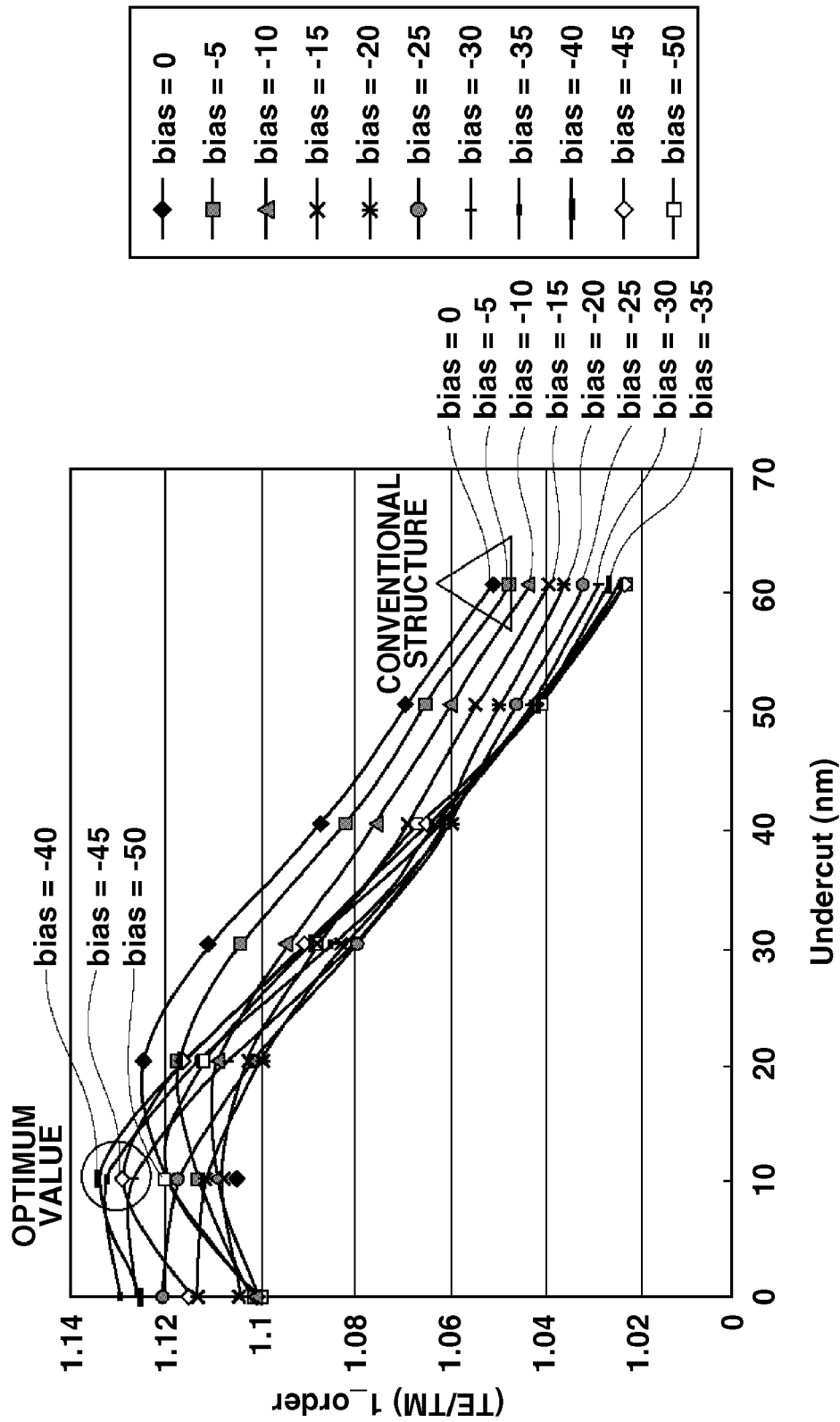

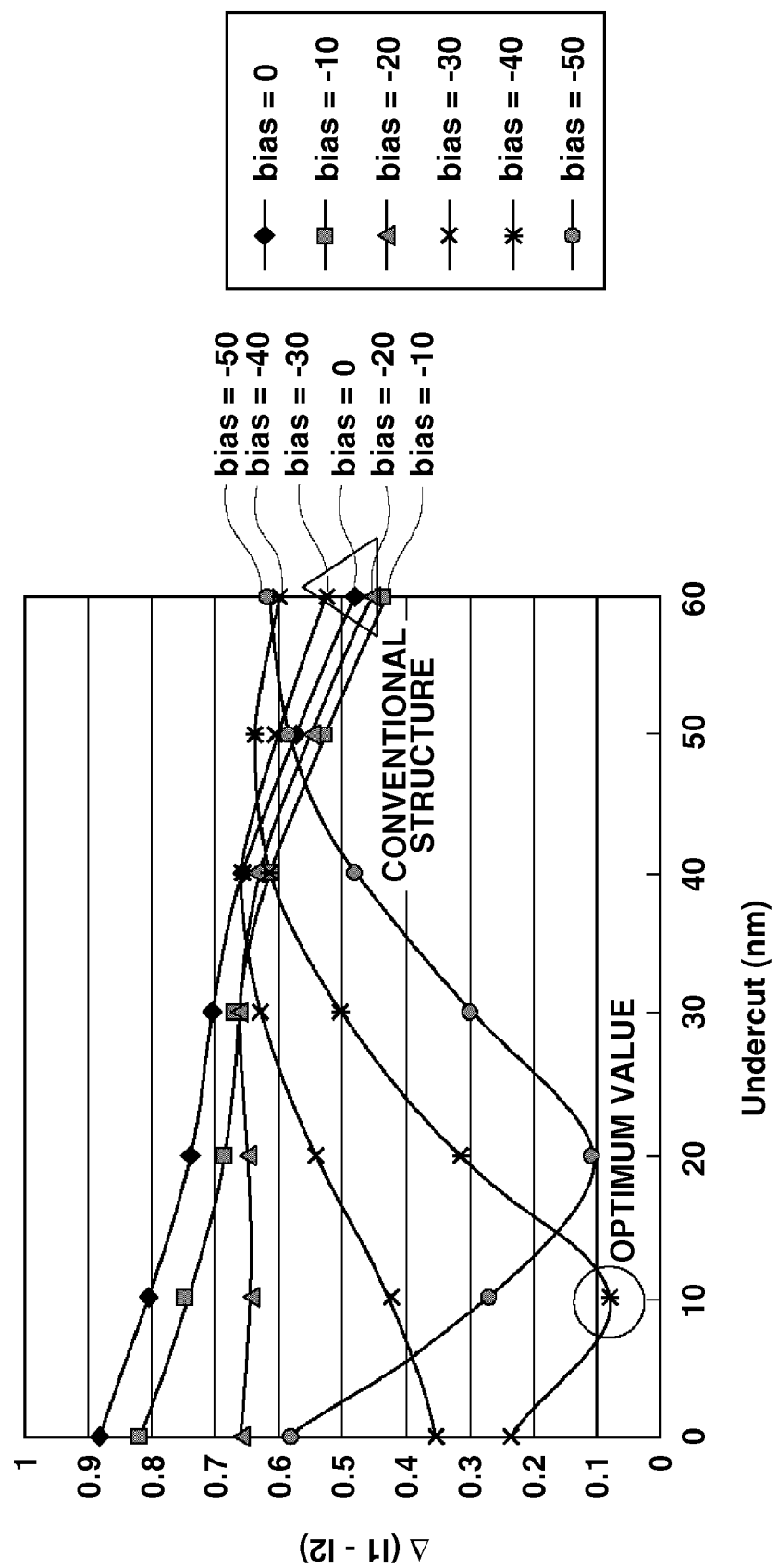

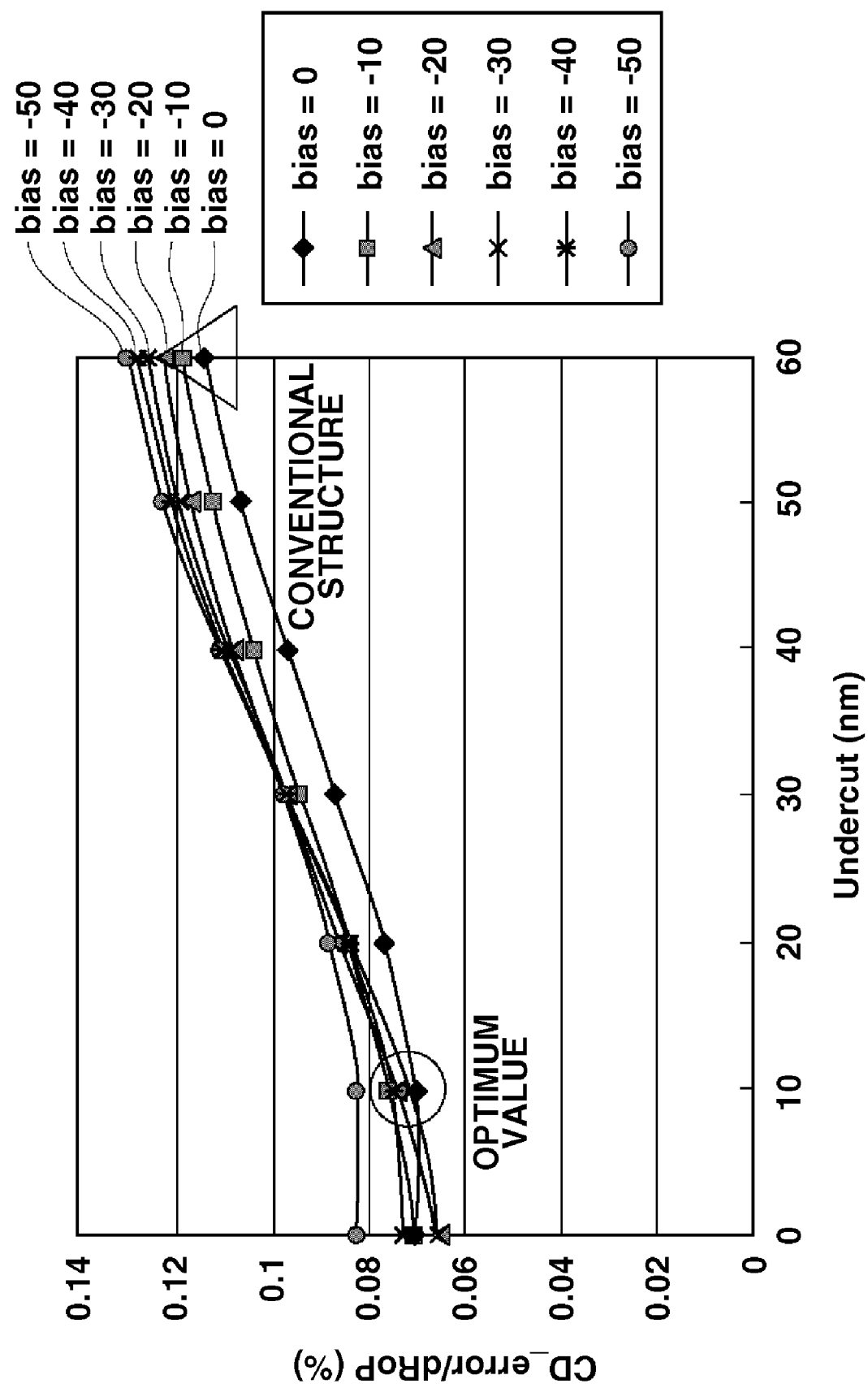

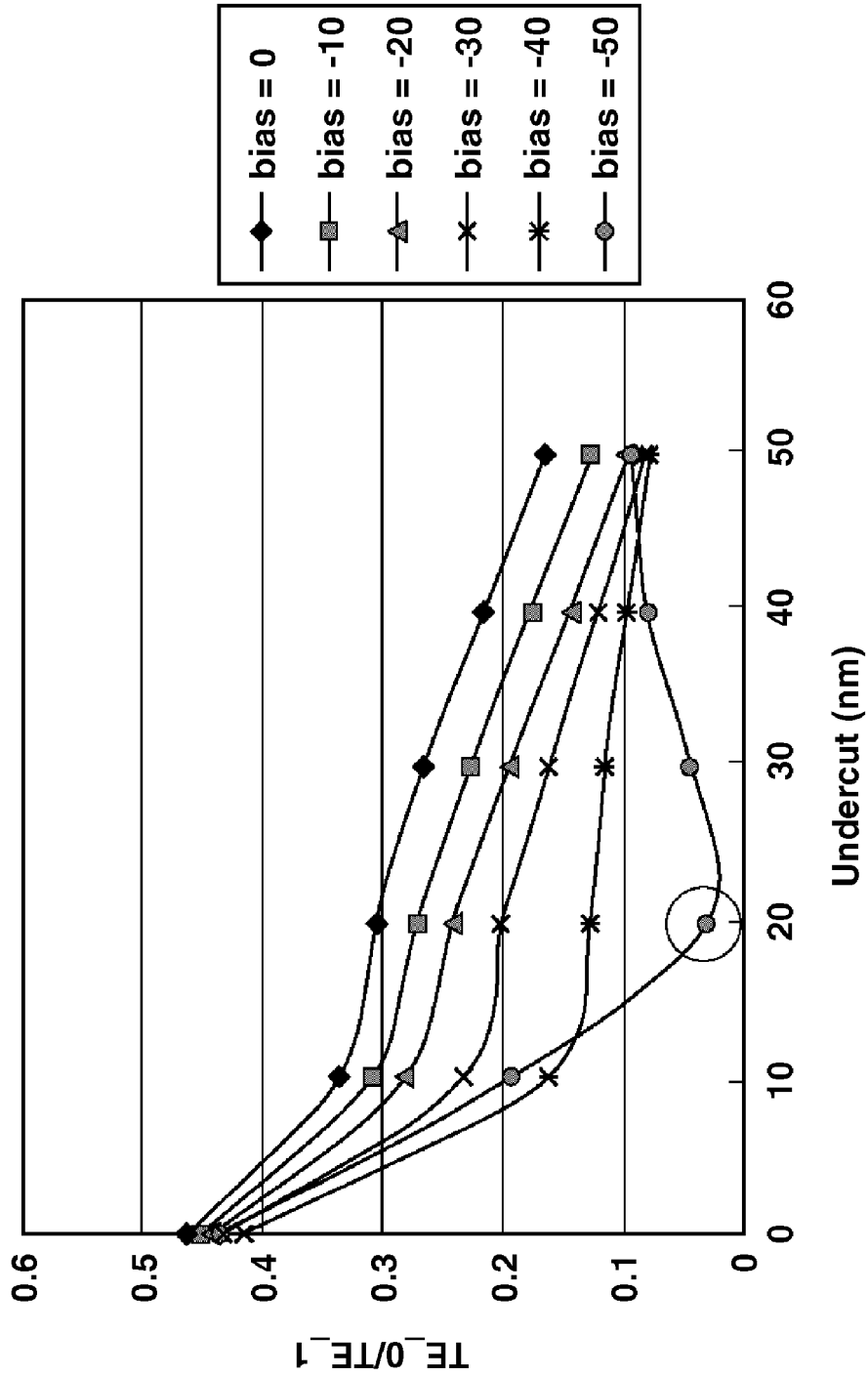

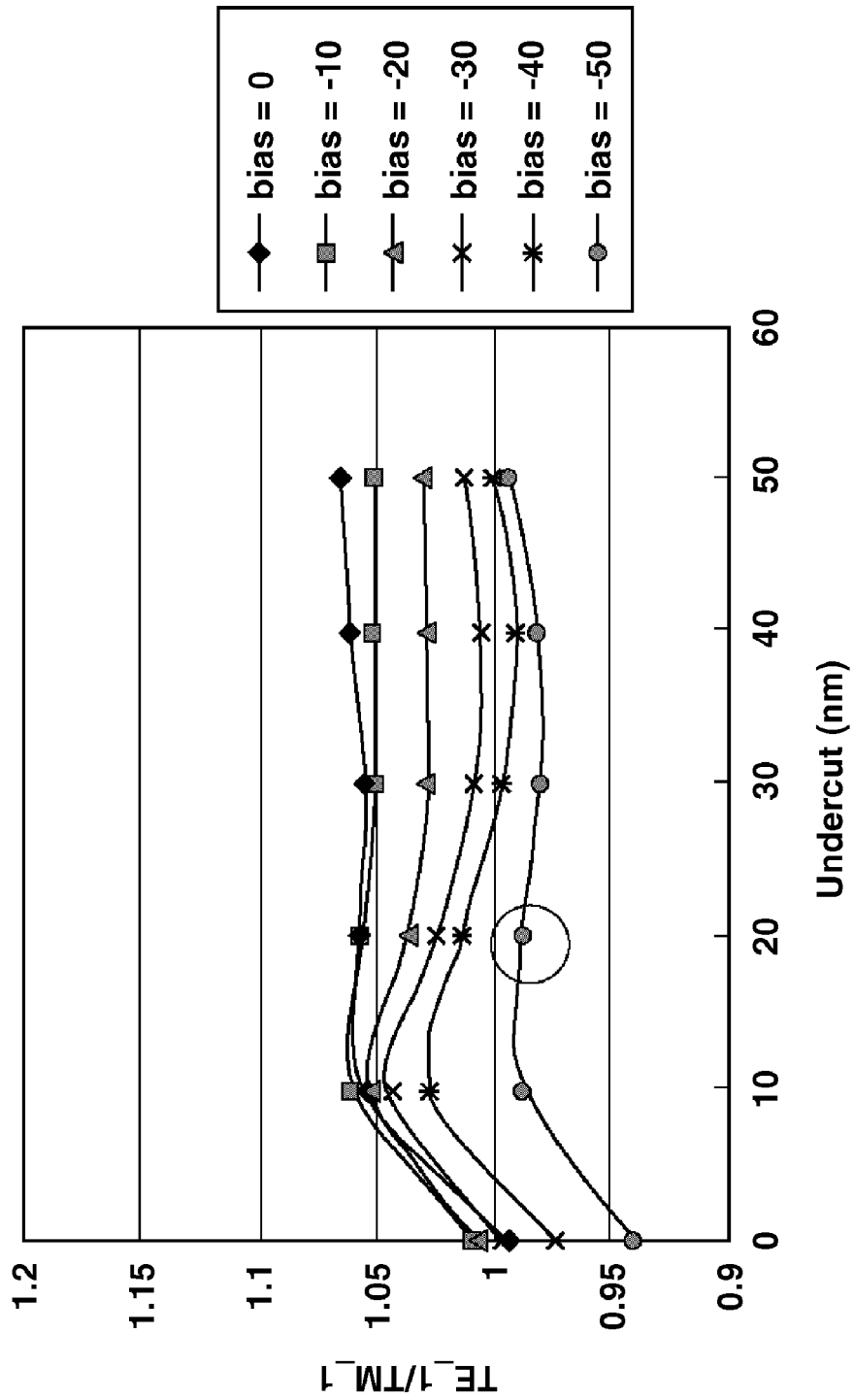

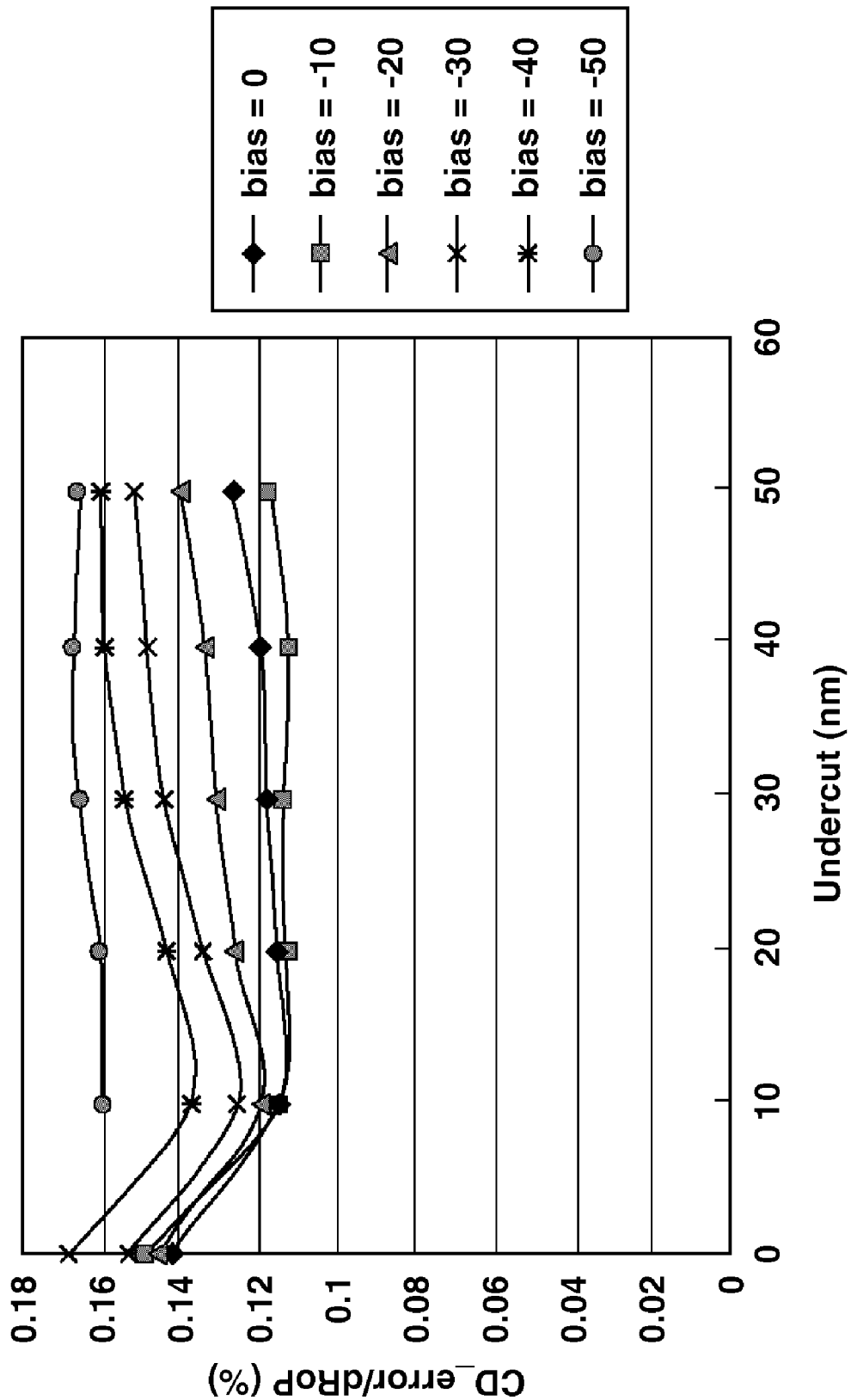

FIG.10A TE_0TH-ORDER/ TE_1ST-ORDER
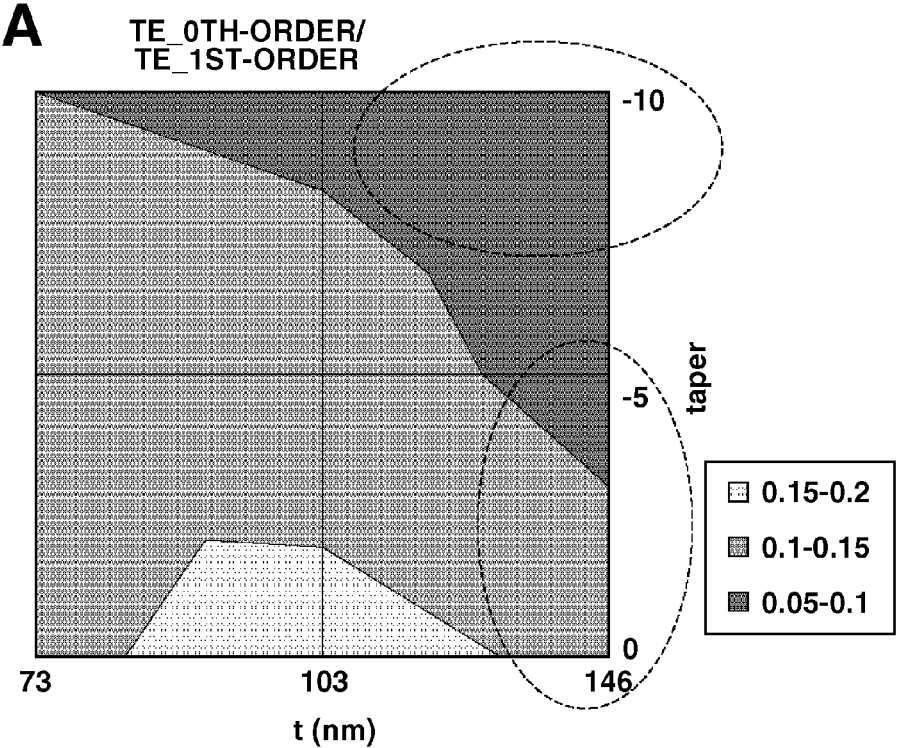
FIG.10B TE_1ST-ORDER/ TM_1ST-ORDER
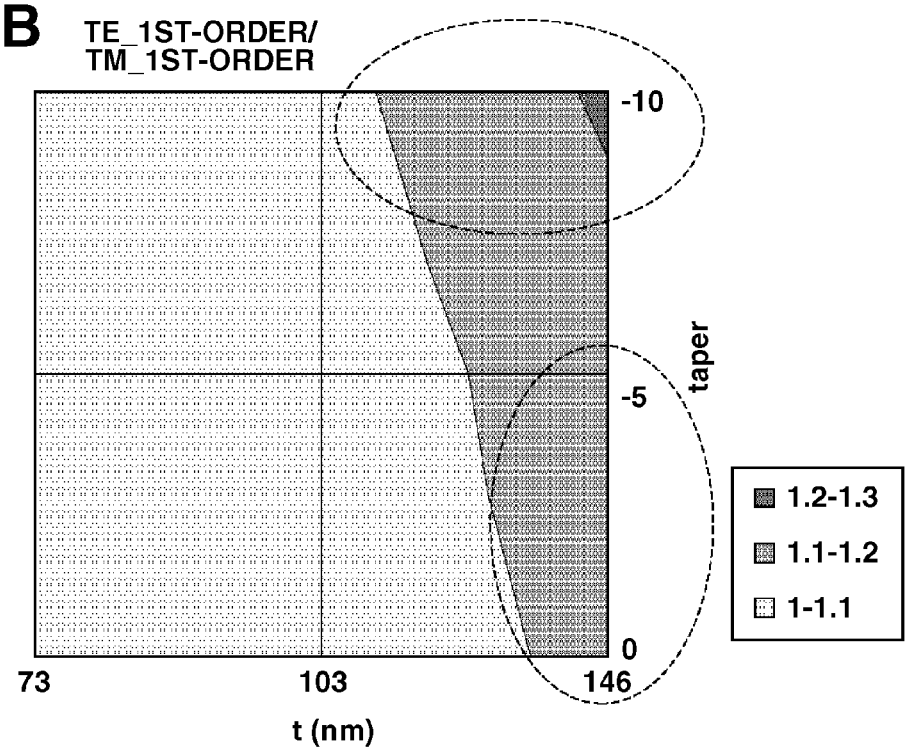

FIG.14

IMAGE SHIFT CHANGE IN DEFOCUS OF ±100 nm, CD_error (nm) IN RoP OF 1%, AND CHANGE IN DOF

| | ABSORBER FILM THICKNESS t (nm) | SIDE WALL ANGLE taper (deg.) | sbias (nm) | abias (nm) | PHASE phase (deg.) | Shift (nm)/ def 200 nm | TE_0/TE_1 | CD_error (nm)/ RoP (%) | dDOF (%)/ RoP (%) | TE_1/TM_1 |
|---|---|---|---|---|---|---|---|---|---|---|
| INITIAL VALUE (CONVENTIONAL STRUCTURE) | 73 | 0 | 50 | 0 | 180 | 4.179 | 0.150853 | 0.139256 | 4.332449 | 1.023338 |
| STRUCTURE 2 | 73 | -10 | 50 | 0 | 180 | 2.523 | 0.093062 | 0.091468 | 2.767857 | 1.115925 |
| STRUCTURE 3 | 146 | -10 | 30 | -30 | 180 | 0.896 | 0.040285 | 0.052156 | 1.454545 | 1.2109 |
| STRUCTURE 4 | 146 | -10 | 40 | -20 | 180 | 1.041 | 0.047196 | 0.032154 | 0.813743 | 1.270505 |
| STRUCTURE 5 | 103 | -10 | 30 | -20 | 170 | 0.536 | 0.019598 | 0.102084 | 3.127875 | 1.096382 |
| STRUCTURE 6 | 103 | -10 | 40 | -10 | 170 | 0.569 | 0.020906 | 0.085935 | 2.650823 | 1.132664 |
| STRUCTURE 7 | 146 | 0 | 30 | -40 | 170 | 0.441 | 0.018348 | 0.094186 | 2.941176 | 1.112503 |
| STRUCTURE 8 | 146 | 0 | 40 | -30 | 170 | 0.969 | 0.035389 | 0.087912 | 2.653248 | 1.124299 |
| STRUCTURE 9 | 146 | -5 | 30 | -20 | 170 | 0.429 | 0.020917 | 0.056662 | 1.633394 | 1.202113 |
| STRUCTURE 10 | 146 | -5 | 40 | -10 | 170 | 0.567 | 0.021096 | 0.043383 | 1.172227 | 1.240994 |

PHASE SHIFT MASK

BACKGROUND OF THE INVENTION

1. Field of the Invention

The present invention generally relates to a phase shift mask.

2. Description of the Related Art

Photolithography generally includes the processes of resist coating, exposure, development, etching, and removal of resist. Exposure is a process of causing an exposure apparatus to transfer a mask pattern onto a photosensitive material (resist) coated on a wafer so that a latent image pattern can be formed on the wafer. In exposure, three factors: resolution, overlay accuracy, and throughput are important. Resolution represents a minimum dimension at which transferring a pattern is feasible. Overlay accuracy represents the accuracy in the process of overlaying a pattern on a wafer with another pattern. Throughput represents the number of wafers processed per unit time.

In the manufacturing of a device using photolithography technology, an exposure apparatus causes a projection optical system to project a pattern of a mask onto a wafer. The projection optical system causes diffracted light from the mask pattern to interfere and form an image on the wafer.

The following equation (Rayleigh equation) defines the resolution R of a projection exposure apparatus where $\lambda$ represents the wavelength of a light source and NA represents a numerical aperture of the projection optical system.

$$R = k_1 (\lambda/NA)$$

In the equation, constant k1 is a variable determined according to a development process. In the ordinary exposure, k1 is in a range approximately from 0.5 to 0.7.

Recent highly integrated devices require, in manufacturing, transferring a fine pattern onto a wafer. More specifically, high resolution is required. As apparent from the above-described equation, increasing the numerical aperture (NA) and reducing the wavelength ($\lambda$) are effective to realize high resolution. An immersion exposure apparatus includes an internal space filled with liquid (e.g. water) between a final lens of the projection optical system and a resist surface. The immersion exposure apparatus can increase the numerical aperture (NA) and, therefore, can realize high resolution. For example, a recently developed immersion exposure apparatus has an NA value equal to or greater than 1. The refractive index of water is approximately 1.44.

However, when the numerical aperture (NA) is increased, polarization of light influences imaging performances. If light is incident on a wafer at a large angle, imaging performances may change due to a difference in polarization direction of the light. Therefore, as discussed in Japanese Patent Application Laid-Open No. 2006-135346, a conventional technique that is useful in improving imaging performances illuminates a mask with only polarized light.

As discussed in IEEE Transaction On Electron Devices, Vol. ED-29, No. 12, DECEMBER 1982, pp. 1828-1836, a Levenson phase shift mask can improve resolution in image formation of a fine pattern composed of thin lines. Usage of the Levenson phase shift mask is effective to reduce the constant $k_1$. FIG. 21 illustrates an example Levenson phase shift pattern, which includes trenches of a glass substrate disposed between light-blocking portions extending in parallel to each other on one side of the glass substrate. The Levenson phase shift pattern illustrated in FIG. 21 defines a phase difference of 180° ($\pi$). The portion defining a phase difference is referred to as a phase shifter or a shifter.

FIG. 22 illustrates an example "small $\sigma$ illumination" having higher coherency. The "small $\sigma$ illumination" has a small aperture as inlet of exposure light. The "small $\sigma$ illumination" can transfer a phase shift mask pattern onto a wafer as illustrated in FIG. 23.

The method using the small $\sigma$ illumination, as discussed in Japanese Patent Application Laid-Open No. 5-109601, includes setting the direction of polarized light to one direction, setting the direction of a mask pattern to one direction, and illuminating a mask with polarized light useful in improving imaging performances.

The phase shift mask is subjected to a problem generally referred to as "0/$\pi$ difference." The "0/$\pi$ difference" causes a dimensional difference between a normal aperture portion and a trenched aperture portion (phase shift portion) as illustrated in FIG. 21. More specifically, even if two aperture portions have the same dimensions in a plan view, a difference in intensity of light may occur between two aperture portions. Then, a significant amount of dimensional error may occur in the result of exposure.

As discussed in detail in Japanese Patent Application Laid-Open No. 2005-345960, the phase shift mask has a unique structure (referred to "undercut") illustrated in FIG. 24 that includes a trench of a substrate and an overhang of an absorber (e.g., chrome) protruding from an upper end of the trench. The "undercut" structure illustrated in FIG. 24 can eliminate adverse effects of reflections of light on side walls of a trench and can reduce the effect of a dimensional difference in a result of exposure. Furthermore, the added method provides a dimensional difference between an aperture portion corresponding to phase 0 and an aperture portion corresponding to phase n and, as a result, brings an effect of correcting an error by an amount equivalent to the provided dimensional difference. FIG. 24 illustrates a dimensional difference referred to as "bias" added to a trench.

As discussed in Japanese Patent Application Laid-Open No. 2005-345960, when a pitch is set to 480 nm on a mask (which is equivalent to a pitch of 120 nm, a line width of 60 nm, and a space width of 60 nm on a wafer), the "0/n difference" can be eliminated by setting an overhang having a length of 80 nm and setting a difference of 60 nm (30 nm on each side) as "0/$\pi$ dimensional difference" on a mask. A desired length of the overhang is equal to or greater than 0.2$\lambda$ (e.g., equal to or greater than 40 nm when the wavelength of ArF is used).

To obtain an image having a pitch of 90 nm, a line width L of 32 nm, and a space width S of 58 nm, it is desired to use a pattern having a pitch of 360 nm, a line width L of 128 nm, and a space width S of 224 nm on a 4× mask. In this case, if a light-blocking portion (absorber) is configured as a line portion, adding an overhang having a length equal to or greater than 40 nm to an absorber having a width of 128 nm is difficult.

And, to obtain an image having a pitch of 90 nm and a line width L of 32 nm with an exposure apparatus having a wavelength of ArF (193 nm) and NA=1.35, it is possible to perform simulation with respect to image formation of a pattern having a pitch of 360 nm and a line width L of 128 nm on a 4× mask while setting a absorber (chrome) thickness to 103 nm. FIG. 25A illustrates, as a problem caused by the "0/$\pi$ difference", a difference in intensity of light between a trench and a non-trench region occurring even if two aperture portions have the same dimension when seen in a plan view. A large dimensional difference or a large image shift may occur when a large difference in intensity of light is caused between a trench and a non-trench region.

The peak difference in intensity of light between a trench and a non-trench region can be estimated by changing the amount of "undercut" and the amount of "bias." The simulation includes illuminating a mask with transverse electric (TE) polarized light and causing a projection optical system to form an image of a mask pattern on a wafer. The mask has a cross-sectional structure (more specifically, a three-dimensional structure) whose dimension is smaller than the wavelength of illumination light. Thus, the simulation includes accurately reproducing a three-dimensional structure of a mask and obtaining diffracted light by performing electromagnetic field analysis on the reproduced three-dimensional structure of the mask. The illumination used for a phase shift mask is usually a coherent illumination. In the electromagnetic field analysis, the incident wave is perpendicular to the mask.

FIG. 25B illustrates results obtained by the simulation. The amount of "undercut" has a positive value if it increases the width of a trench. The amount of "bias" has a positive value if it increases the width S of an absorber. The reference point is set to a position where the line width and the space width have original values (L=128 nm and S=224 nm). In FIG. 25B, the abscissa axis indicates the amount of "undercut" and the ordinate axis indicates a peak difference (I1−I2) in intensity of light between a peak (I1) at anon-trench region and a peak (I2) at a trench in a best focus state. FIG. 25B illustrates some examples of the peak difference (I1−I2) obtained by changing a combination of "bias" and "undercut."

As understood from the results illustrated in FIG. 25B, some of the combinations of "bias" and "undercut" can eliminate the peak difference (I2−I1) in intensity of light. However, it is unknown which combination is suitable for solving the "0/π difference" problem. More specifically, it is unknown how to determine the amount of "bias" and the amount of "undercut."

There are various mask structures (cross-sectional structures) conventionally known as discussed in Japanese Patent Application Laid-Open No. 2005-182031 or in Japanese Patent Application Laid-Open No. 2005-321641. However, it is unknown which structure is an optimum structure for resolving a pitch less than the wavelength of illumination light.

If the half pitch or the width of an absorber becomes smaller than 45 nm, it is difficult for the conventional mask structures to set a sufficient amount of "undercut" that can eliminate the "0/π difference." It is unknown how to determine the amount of "undercut" as well as the amount of "bias" to eliminate the "0/π difference."

Furthermore, if a mask structure has dimensions equivalent to or less than the wavelength of illumination light, diffraction efficiency may change depending on the polarization direction according to a three-dimensional structure of the mask. It is unclear whether a change in diffraction efficiency has adverse effects on exposure performances. On the other hand, if a polarized light illumination is used, an exposure apparatus may include an error in the direction of polarized light. Although a deviation from the target polarization direction is a small amount equivalent to approximately ±1% of the entire intensity, CD error may occur due to device differences in respective exposure apparatuses, or polarization control, or polarization direction changes occurring due to birefringence in a glass material.

SUMMARY OF THE INVENTION

Exemplary embodiments of the present invention are directed to a phase shift mask having small critical dimension (CD) error sensitivity to variations in polarization state.

According to an aspect of the present invention, a phase shift mask includes a substrate including two different types of transmissive regions alternately disposed, and absorbers disposed on a surface of the substrate such that each absorber is provided between the two types of transmissive regions. The two types of transmissive regions include a first transmissive region having a trench for providing a phase shift and a second transmissive region having no trench. A part of the surface of the substrate is exposed between a side wall of the trench and a side wall of the absorber adjacent the side wall of the trench.

According to another aspect of the present invention, a phase shift mask includes a substrate including first and second transmissive regions alternately disposed, and absorbers disposed on a surface of the substrate such that each absorber is provided between the first and second transmissive regions. A phase shifter is defined by a difference between a surface height of the first transmissive region and a surface height of the second transmissive region. At least the first transmissive region of the first and second transmissive regions has a trench. An aperture portion formed between opposite side walls of respective adjacent absorbers has a width that increases along a depth direction of the substrate. Each trench has a width that increases along the depth direction of the substrate. According to another aspect of the present invention, a mask includes a substrate including absorbers or phase shifter parts, and transmissive regions disposed between respective adjacent absorbers or respective adjacent phase shifter parts. An aperture portion formed between opposite side walls of respective adjacent absorbers has a width that increases along a depth direction of the substrate.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments and features of the invention and, together with the description, serve to explain at least some of the principles of the invention.

FIG. 5A illustrates the ratio in amplitude between 0th-order diffracted light of TE polarized light and 1st-order diffracted light of TE polarized light incident on a projection optical system, which is obtained by simulation.

FIG. 5B illustrates the ratio in amplitude between 1st-order diffracted light of TE polarized light and 1st-order diffracted light of transverse magnetic (TM) polarized light incident on a projection optical system, which is obtained by simulation.

FIG. 6A illustrates example relationships between "undercut" and the width of change amount Δ(I1–I2) that represents a difference in peak intensity in an allowable depth of focus.

FIG. 6B illustrates example relationships between "undercut" and "CD_error/dR$_O$P" that represents changes in CD error corresponding to variations in polarization degree.

FIG. 7A illustrates the ratio in amplitude between 0th-order diffracted light of TE polarized light and 1st-order diffracted light of TE polarized light.

FIG. 7B illustrates the ratio in amplitude between 1st-order diffracted light of TE polarized light and 1st-order diffracted light of TM polarized light.

FIG. 8B illustrates example relationships between "undercut" and "CD_error/dR$_O$P" that represents changes in CD error corresponding to variations in polarization degree.

FIG. 10A is a contour map illustrating the ratio in amplitude between 0th-order diffracted light of TE polarized light and 1st-order diffracted light of TE polarized light in relation to absorber thickness "t" and "taper."

FIG. 10B is a contour map illustrating the ratio in amplitude between 1st-order diffracted light of TE polarized light and 1st-order diffracted light of TM polarized light in relation to absorber thickness "t" and "taper."

FIG. 14 is a table illustrating mask structures, parameters representing respective structures, ratios in amplitude between 0th-order diffraction efficiency of TE polarized light and 1st-order diffraction efficiency of TE polarized light, ratios in amplitude between 1st-order diffraction efficiency of TE polarized light and 1st-order diffraction efficiency of TM polarized light, and optical performances.

DETAILED DESCRIPTION OF THE EMBODIMENTS

Figure 1:
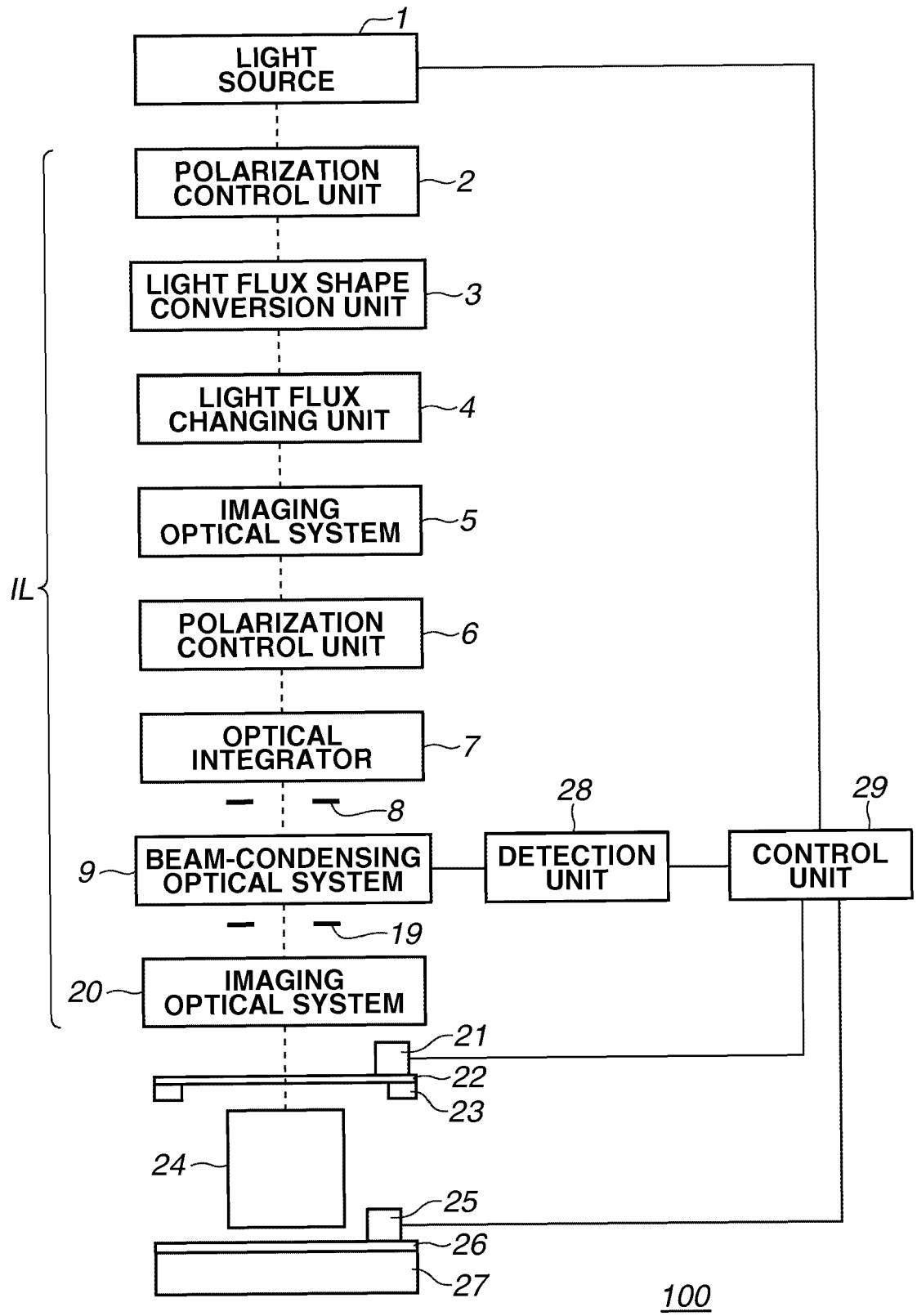
FIG. 1 illustrates a schematic example exposure apparatus according to an exemplary embodiment of the present invention.

The following description of exemplary embodiments is illustrative in nature and is in no way intended to limit the invention, its application, or uses. It is noted that throughout the specification, similar reference numerals and letters refer to similar items in the following figures, and thus once an item is described in one figure, it may not be discussed for following figures. Exemplary embodiments will now be described in detail with reference to the drawings.

FIG. 1 illustrates an example exposure apparatus according to an exemplary embodiment of the present invention. An exposure apparatus 100 includes an illumination optical system IL, a mask stage 23, a projection optical system 24, a wafer stage 27, and a control unit 29. The mask stage 23 holds (or carries) a mask 22. The wafer stage 27 holds (or carries) a wafer 26. The exposure apparatus 100 causes the projection optical system 24 to project a pattern of the mask 22 onto the wafer 26 and subject the wafer 26 to exposure light reflecting the pattern formed on the mask 22. The mask 22 may be referred to as "reticle" or "original plate."

For example, the exposure apparatus 100 can be configured as an immersion exposure apparatus, or an ordinary exposure apparatus that does not use any liquid. Moreover, the exposure apparatus 100 can be configured as a step-and-scan exposure apparatus, a step-and-repeat exposure apparatus, or any other type of exposure apparatus.

The illumination optical system IL includes a light source 1 that emits light to illuminate the mask 22. For example, the illumination optical system IL includes a polarization control unit 2, a light flux shape conversion unit 3, a light flux changing unit 4, an imaging optical system 5, a polarization control unit 6, an optical integrator 7, a variable diaphragm 8, a beam-condensing optical system 9, a masking blade 19, an imaging optical system 20, and a detection unit 28.

The light source 1 is, for example, an argon fluoride (ArF) excimer laser that generates light having a wavelength of approximately 193 nm, a krypton fluoride (KrF) excimer laser that generates light having a wavelength of approximately 248 nm, or a F2 laser that generates light having a wavelength of approximately 153 nm. If the light source 1 is a laser, it is desired to use an incoherent optical system that can change coherent light flux into incoherent light flux. The light source 1 is not limited to a laser. A mercury lamp or a xenon lamp can be used as an alternative.

When polarized light illumination is used, linear polarized light of the laser can be directly used if the light source 1 is a laser. Furthermore, it is necessary to input a constant amount of linear polarized light into an illumination optical system irrespective of difference in the polarization direction of a laser beam that varies depending on a setup state of a laser and an arrangement of an optical system (not shown) that guides a laser. Hence, it is desired that the polarization control unit 2 include a λ/2 phase plate to input X polarized light. If a non-polarized light illumination is used, a phase elimination plate (or a phase adjusting plate) placed on an optical path can convert linear polarized light into random polarized light.

The light flux shape conversion unit 3 changes light from the light source 1 into a light flux having a desired shape in distribution, such as a circular or annular shape or a multipolar shape if necessary, on a Fourier transform plane (a surface conjugate to a pupil of the projection optical system 24). The light flux having the distribution formed on the Fourier transform plane can be adjusted into a desired effective light source shape on an illuminated surface according to the shape changed by the light flux changing unit 4 or the size changed by the imaging optical system 5 that can change the magnification, and restrictions by a diaphragm member.

The light flux shape conversion unit 3 can be configured to include an optical integrator (including at least one of a fly-eye lens, an optical pipe using internal reflections, and a diffractive optical element), a relay optical system, a beam-condensing optical system, and a mirror.

The light flux changing unit 4 is disposed in the vicinity of the Fourier transform plane. The light flux changing unit 4 can be configured to include a conical optical element, parallel flat plates, an appropriate diaphragm member (e.g., annular aperture stop, quadrupolar aperture stop, or circular stop), a pyramidal optical element or an enlargement/reduction beam expander that can change the magnification. After the light flux shape conversion unit 3 has changed a light flux into a basic shape, the light flux changing unit 4 changes the shape and the size of the light flux. The light flux changing unit 4 can be placed at a position away from the optical path.

The light flux exiting the light flux changing unit 4 successively passes through the imaging optical system 5 and a further polarization control unit 6. The imaging optical system 5 can change the magnification.

The polarization control unit 6 can include a plurality types of λ/2 phase plates. For example, the polarization control unit 6 has a function of changing the polarization direction of linear polarized light. Alternatively, the polarization control unit 6 can have a function of converting a light flux into a tangential polarized light illumination or a radial polarized light illumination by setting a predetermined polarization state for a plurality of regions of a λ/2 phase plate.

The optical integrator 7 forms a plurality of secondary light sources in the vicinity of an exit surface to uniformly illuminate the mask 22. The beam-condensing optical system 9 and the masking blade 19 are disposed behind the optical integrator 7 on the optical path. A beam splitter (not shown), such as a half mirror, is disposed behind the beam-condensing optical system 9 on the optical path. The beam splitter has a function of dividing incident light into light traveling toward the mask 22 and light traveling toward the detection unit 28. The detection unit 28 monitors the illumination light directed toward the wafer 26.

A further detection unit 21, disposed in the vicinity of the mask 22, measures the distribution of an effective light source and the state of polarization. The detection unit 21 can be inserted into or removed from a space between the mask 22 and the projection optical system 24. For example, Japanese Patent Application Laid-Open No. 2006-303196 (corresponding to U.S. Patent Application Publication No. 2006/0238736) or Japanese Patent Application Laid-Open No. 2006-279017 (U.S. Patent Application Publication No. 2006/0210911) discusses an example of the detection unit 21.

Another detection unit 25, disposed in the vicinity of the mask 26, measures the state of polarization. The detection unit 25 can be inserted into or removed from a space between the wafer stage 27 and the projection optical system 24. For example, the detection unit 25 includes two sensors and is configured to measure the dose for each polarized light component (e.g., a polarized light component in the X direction and a polarized light component in the Y direction).

The imaging optical system 20 illuminates the mask 22 with light having a shape regulated by the masking blade 19. The projection optical system 24 projects diffracted light exiting the mask 22 onto the wafer 26. The mask 22 and the wafer 26 are disposed in an optically conjugate relationship.

FIG. 3A, FIG. 3B, and FIGS. 4A through 4C illustrate cross-sectional views of example masks. The mask stage 23 holding the mask 22 can be driven by a driving mechanism (not illustrated). For example, the mask stage 23 and the projection optical system 24 are mounted on a stage barrel support, which is supported by a base frame placed on a floor via a damper. The driving mechanism for the mask stage 23 is, for example, a linear motor.

The projection optical system 24 causes diffracted light having passed through a pattern formed on the mask 22 to form an image on a wafer. For example, the projection optical system 24 is an optical system composed of a plurality of lens elements or an optical system (catadioptric optical system) including at least one concave mirror in addition to a plurality of lens elements. Alternatively, the projection optical system 24 can be configured as an optical system including a plurality of lens elements and at least one diffractive optical element (e.g., kinoform). If correcting chromatic aberration is necessary, a plurality of lens elements made of glass members mutually different in dispersion value (Abbe value) can be used or a diffractive optical element and a lens element can be configured to generate dispersions in directions opposed to each other.

The wafer stage 27 holding the wafer 26 can be driven by a driving mechanism (not illustrated). An example mechanism for driving the wafer stage 27 can include a linear motor. A laser interferometer can monitor the mask stage 23 and the wafer stage 27, which move together while keeping a predetermined speed ratio between them.

Figure 2A:
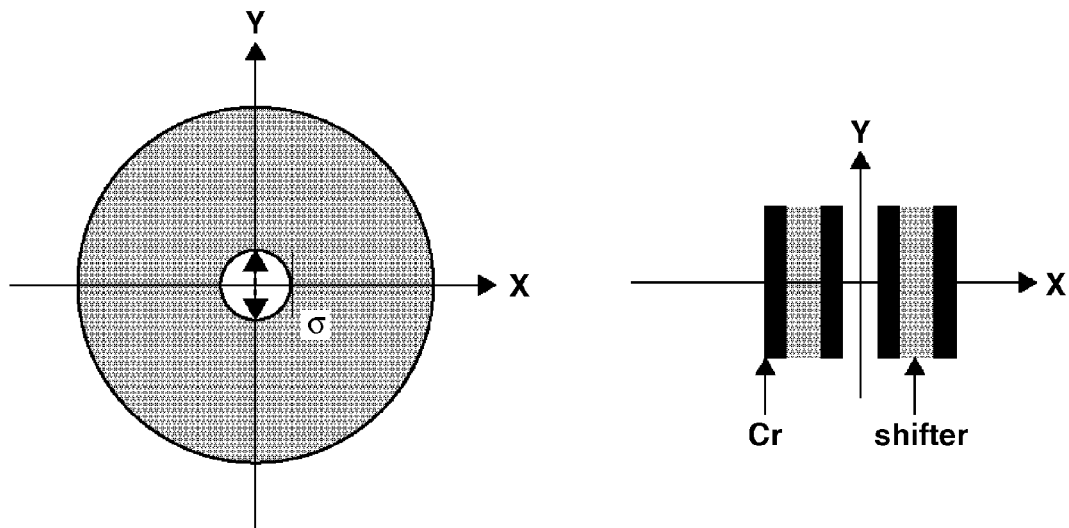
FIG. 2A illustrates an example shape of an effective light source on a Fourier transform plane.
Figure 2B:
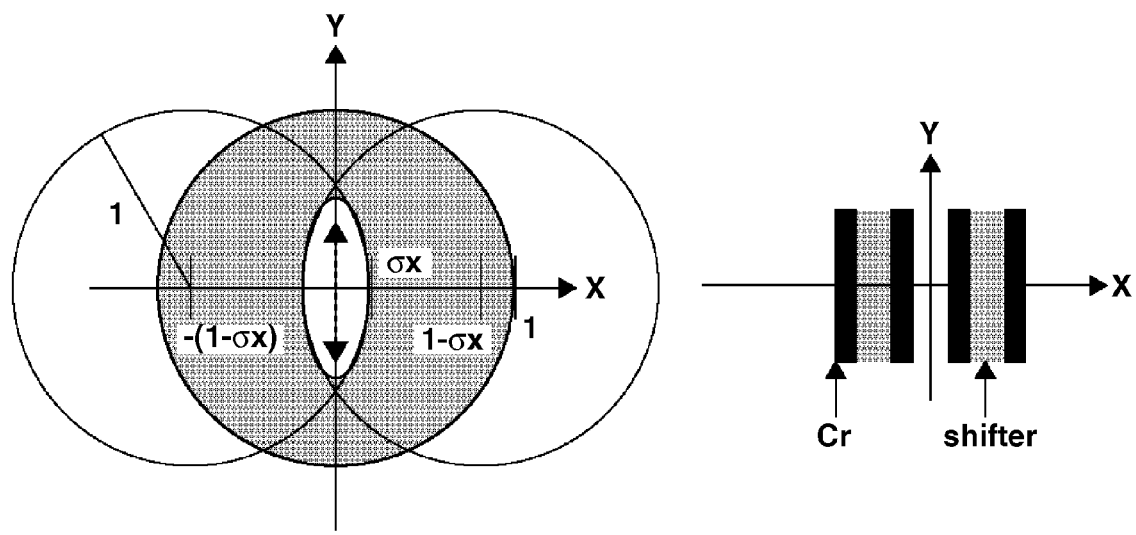
FIG. 2B illustrates an example shape of an effective light source on a Fourier transform plane.

FIGS. 2A and 2B illustrate example shapes of an effective light source on the Fourier transform plane. In FIGS. 2A and 2B, a white region indicates incident light. FIG. 2A illustrates an example small σ illumination. In this case, σ represents a ratio between NA of the illumination optical system IL and NA of the projection optical system. For example, σ is equal to or less than 0.2. The polarization direction accords with a direction perpendicular to the direction defining the periodic pattern of fine pitch on a mask. NA of the illumination optical system IL is $n_o \cdot \sin \theta_{il}$ (the refractive index "$n_o$" of an illumination-side medium is usually 1 and $\theta_{il}$ represents a maximum incident angle). NA of the projection optical system 24 is $n_f \cdot \sin \theta$ (the refractive index "$n_f$" of an image-side medium is 1.44 in the case of water and θ represents a maximum incident angle).

FIG. 2B illustrates an effective light source suitable for optimization in only one direction. The effective light source is a region where two circles are partly overlapped with each other, when the radius of each circle is equal to 1 and $X=\pm(1-\sigma_x)$ represents the centers of two circles. $\sigma_X$ represents a ratio between NA of the illumination optical system IL on the X axis and NA of the projection optical system 24. For example, $\sigma_X$ is equal to or less than 0.2.

An example embodiment uses a fine pitch pattern that defines a periodic pattern in the X direction. Regarding the light emitted from the effective light source illustrated in FIG. 2B, when 0th-order diffracted light enters a region of $-\sigma_X \leq X \leq \sigma_X$ on the X-axis (Y=0), which passes through the center of the effective light source, and ±1st-order diffracted light enters the pupil, all of ±1st-order diffracted light enters the pupil even if corresponding 0th-order diffracted light enters a region other than the region on the X axis (not Y=0).

Figure 3A:
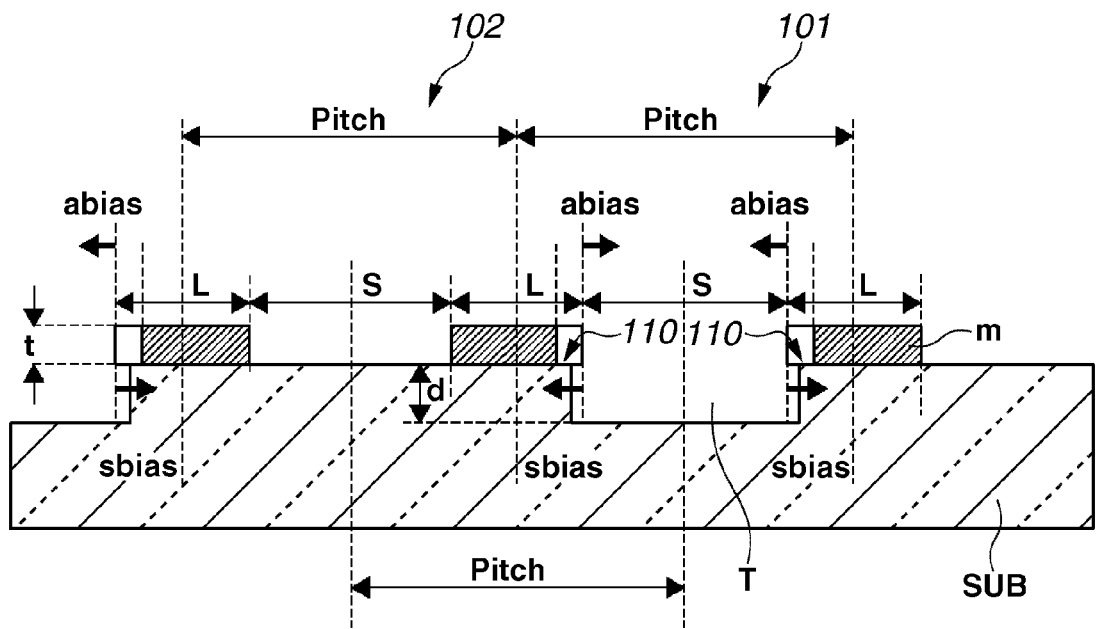
FIG. 3A illustrates a cross-sectional view of a phase shift mask according to a first exemplary embodiment of the present invention.
Figure 3B:
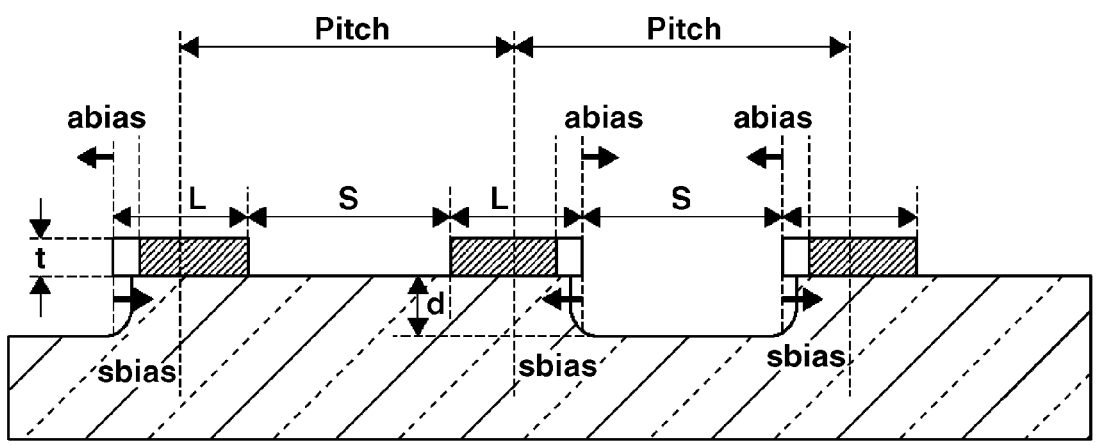
FIG. 3B illustrates a cross-sectional view of a phase shift mask according to the first exemplary embodiment of the present invention.

FIGS. 3A and 3B are cross-sectional views of phase shift masks according to the first exemplary embodiment of the present invention. The phase shift mask according to the first exemplary embodiment includes a transmissive substrate "SUB" including two types of transmissive regions 101 and 102 alternately disposed and a plurality of light-blocking films (absorbers) "m" disposed on a surface of the transmissive substrate "SUB" such that each absorber "m" is sandwiched between the two different types of transmissive regions 101 and 102. The first transmissive region 101 (one of two types of transmissive regions) has a trench (groove) "T" for phase shift. The second transmissive region 102 (the other of two types of transmissive regions) has no trench. A part 110 of the surface of the transmissive substrate "SUB" is exposed between a side wall of the trench and a side wall of the absorber "m" to form a protrusion having a stepped shape in conjunction with the absorber "m" and the trench.

A trenched amount "d" represents a vertical size of the trench (groove) T formed in the first transmissive region 101, i.e., a trench size in the depth direction of the transmissive substrate "SUB". The trenched amount "d" is determined depending on a wavelength λ of exposure light and a refractive index "n" of the transparent substrate "SUB". In general, the trenched amount "d" is set to a value satisfying a relationship $d=\lambda/2(n-1)$.

An example structure of the phase shift mask according to the first exemplary embodiment is described below in more detail. The trench (groove) "T" for phase shift has a lateral width that is equivalent to a sum of the width of a space portion S and a total length of two undercut portions provided at both ends of the space portion S when a line-and-space pattern is composed of line portions L (corresponding to light-blocking portions "m") and space portions S (corresponding to transmissive regions 101 and 102).

An example method for forming the trench "T" for phase shift includes letting dry etching advance in the depth direction to form a trench and then letting wet etching advance in the horizontal direction to form undercut portions.

The absorber "m" has a width approximately equal to the width of the line portion L. The first transmissive region (including a trench) 101 and the second transmissive region (including no trench) 102 are different in aperture width to provide a "bias."

Figure 24:
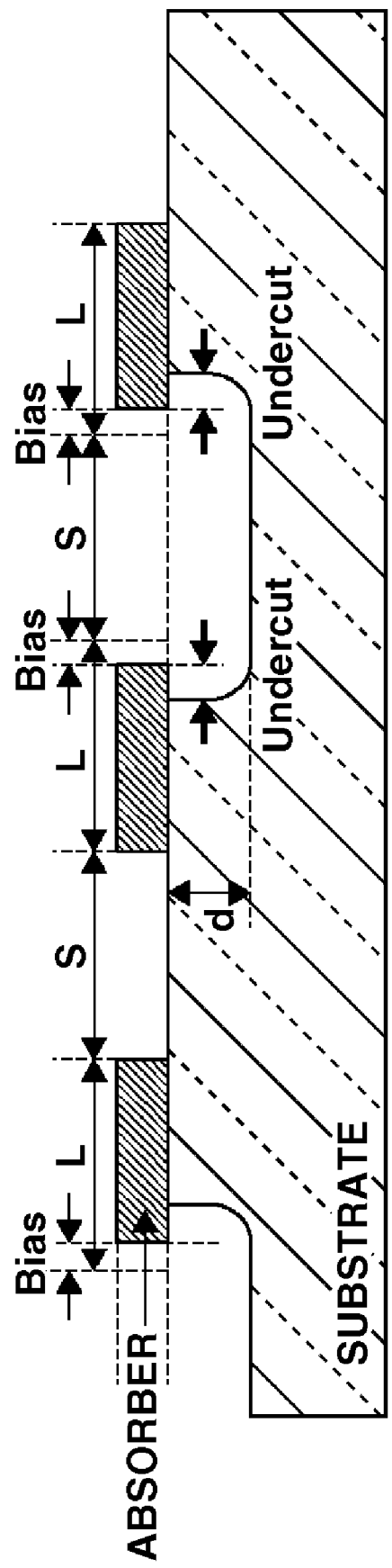
FIG. 24 illustrates an example phase shift mask.

FIG. 24 illustrates a cross-sectional structure of an ordinary phase shift mask having a single trench structure. FIG. 3A illustrates a structure resulting from optimization performed on the amount of "undercut" and the amount of "bias." The absorber m has no overhang and a trench does not include any portion that can be referred to as "undercut." In the following description, a bias amount "sbias" represents a size difference of the first transmissive region (trench) 101 functioning as a phase shifter compared to a design value of space width S.

Furthermore, a bias amount "abias" represents a size difference of the absorber m compared to a design value of line width L. The bias amount "abias" determines a dimensional difference of the first transmissive region (including a trench) 101 only.

The bias amount "sbias" is a bias amount at one end of a space portion. The bias amount "sbias", if its value is positive, increases the width of the space portion S. Similarly, the bias amount "abias", if its value is positive, increases the width of the absorber m. The bias amount "abias" defines a bias effective for the trench 101 only. The reference point is set to a position defined by the designed line width L and the designed space width S.

In this case, it is desired to satisfy the following relationships:

$$abias<0,$$

$$sbias>0,$$

$$|abias|>|sbias|$$

$$(170/180)\lambda/2(n-1) \leq d \leq \lambda/2(n-1).$$

The absorber "m", which functions as an absorber of light, is, for example, made of chrome. The transparent substrate "SUB" is, for example, made of quartz glass. An example method for manufacturing a mask is an ordinary method that includes determining a region of a absorber "m" by dry etching and letting the dry etching advance in the depth direction of the transparent substrate "SUB" to form a trench. In this case, the method can omit a wet etching process for widening the trench in the horizontal direction because a process of forming the undercut is unnecessary. Thus, the manufacturing processes can be simplified. As illustrated in FIG. 3B, a trench can include a rounded corner at the base.

Figure 4A:
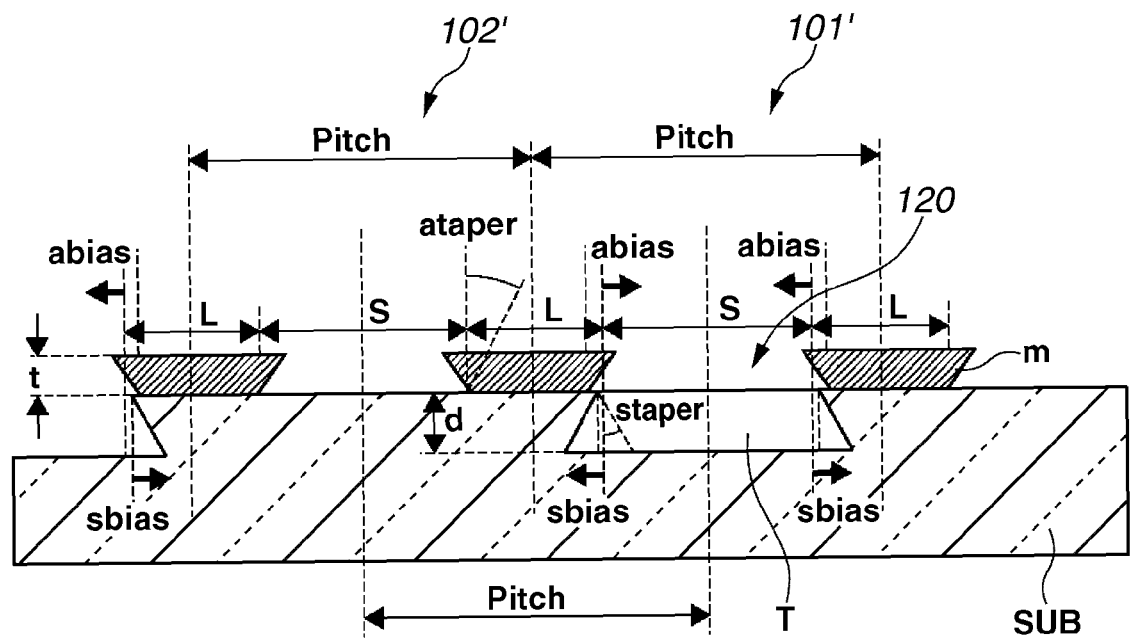
FIG. 4A illustrates a cross-sectional view of a phase shift mask according to a second exemplary embodiment of the present invention.
Figure 4B:
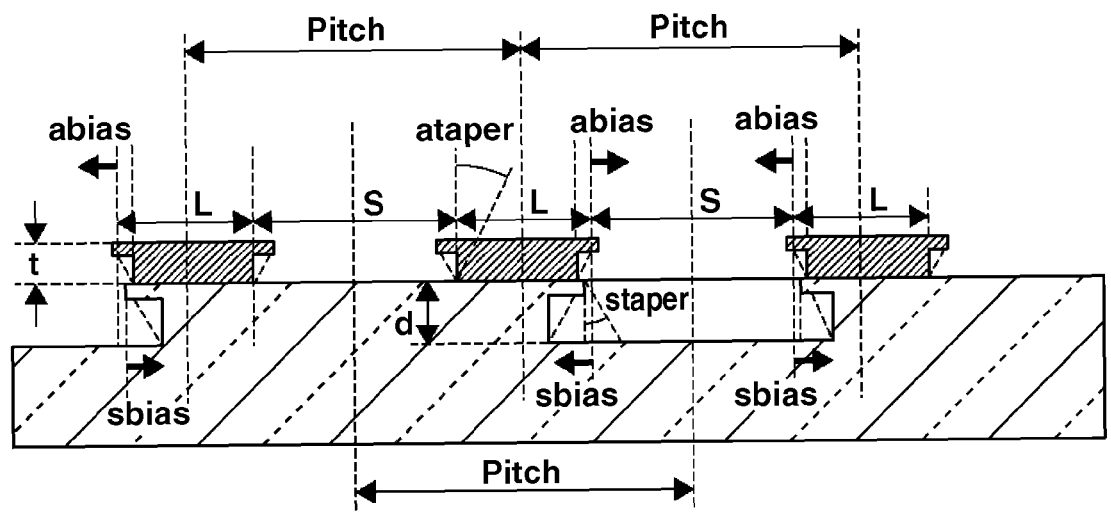
FIG. 4B illustrates a cross-sectional view of a phase shift mask according to the second exemplary embodiment of the present invention.
Figure 4C:
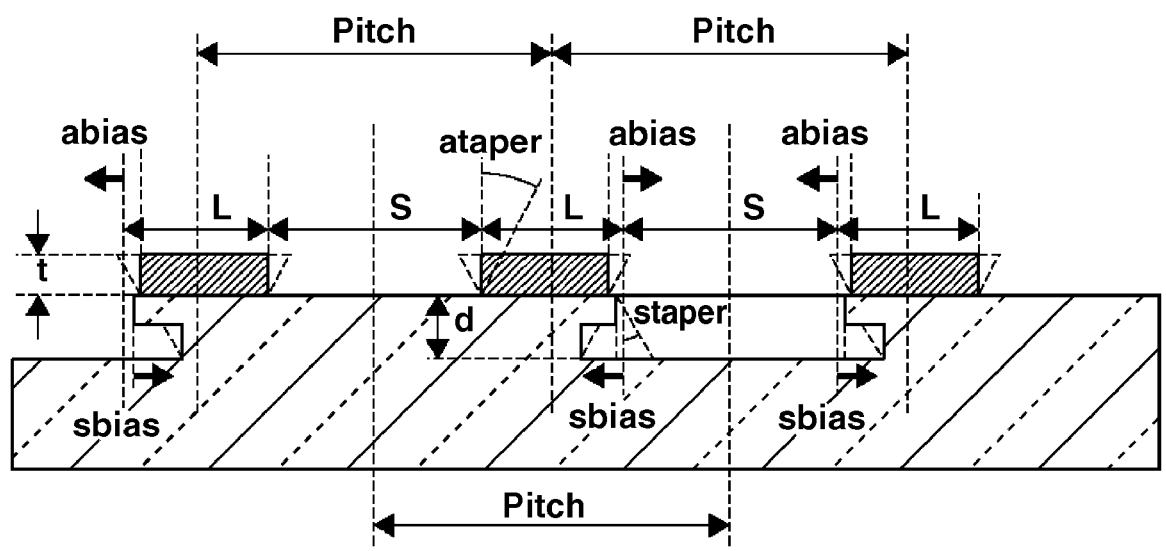
FIG. 4C illustrates a cross-sectional view of a phase shift mask according to the second exemplary embodiment of the present invention.

FIGS. 4A through 4C are cross-sectional views of phase shift masks according to a second exemplary embodiment of the present invention. The phase shift mask includes a transmissive substrate "SUB" including first transmissive regions 101' and second transmissive regions 102' alternately disposed, and a plurality of light-blocking films (absorbers) "m" disposed on a surface of the transmissive substrate "SUB" such that each absorber "m" is sandwiched between the first and second transmissive regions 101' and 102'. The difference in height between a surface of the first transmissive region 101' and a surface of the second transmissive region 102' defines a phase shifter.

The first transmissive region 101' (i.e., at least one of the first transmissive region 101' and the second transmissive region 102') has the trench T. An aperture portion 120 formed between opposite side walls of respective adjacent light-blocking films (absorbers) "m" has a width that increases along a depth direction of the transmissive substrate "SUB". The trench "T" also has a width that increases along the depth direction of the transmissive substrate "SUB".

When "d" represents the thickness of a phase shifter defined by the difference between a surface height of the first transmissive region 101' and a surface height of the second transmissive region 12', "n" represents a refractive index of the transmissive substrate "SUB", and "X" represents a wavelength of exposure light, it is desired to satisfy the following relationship:

$$(170/180)\lambda/2(n-1) \leq d \leq \lambda/2(n-1).$$

An example arrangement of the phase shift mask according to the second exemplary embodiment is described in more detail. In the following description, "ataper" represents the angle of inclination of a side wall of the absorber "m" relative to the vertical line (i.e., a normal of the transparent substrate "SUB"). Furthermore, "staper" represents the angle of inclination of a side wall of the trench "T" (shifter portion of the transparent substrate "SUB") relative to the vertical line (i.e., a normal of the transparent substrate "SUB"). When a side wall has a positive angle of inclination, the width of an aperture portion decreases according to an increase in the depth from the top surface of the absorber "m" or the top surface of the transparent substrate "SUB". In this case, it is desired to satisfy the following relationships:

ataper≦0, and staper≦0.

More specifically, it is desired to set the inclination angles "ataper" and "staper" of the side walls such that the width of an aperture portion increases according to an increase in the depth from the top surface of the absorber "m" or the top surface of the transparent substrate "SUB".

Definitions for "abias" and "sbias" are already given in the description referring to FIGS. 3A and 3B. The reference position is set to a boundary between the space S and the line L on a surface along which the absorber "m" contacts the transparent substrate "SUB". In this case, it is desired to satisfy the following relationships:

abias≦0, sbias≧0, and

|abias|≧|sbias|.

It is desired that "staper" is approximately equal to "ataper." It is also desired that either "staper" or "ataper" is an acute angle and the other is approximately equal to a right angle. The side wall angles "staper" and "ataper" can be optimized independently as mutually different values. The inclination angle "staper" defining a shifter has large effect on 1st-order diffraction efficiency of TE polarized light. In the following description, "staper" and "ataper" may be simply referred to as "taper."

A desired side wall angle (taper) is variable depending on the thickness (t(nm)) of the absorber "m." More specifically, a desired side wall angle (taper) increases when the thickness of the absorber "m" decreases. Furthermore, a desired side wall angle (taper) is variable depending on the pitch or the line width of the absorber "m." A desired side wall angle (taper) increases when the pitch or the line width of the absorber "m" decreases.

Figure 19A:
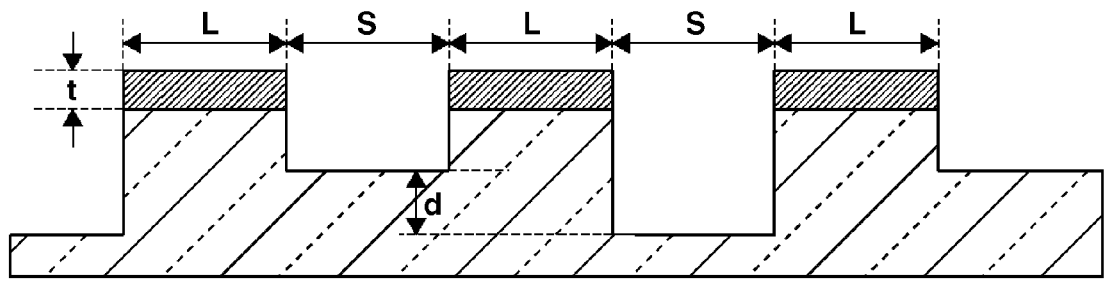
FIG. 19A illustrates an example phase shift mask having a dual trench structure.
Figure 19B:
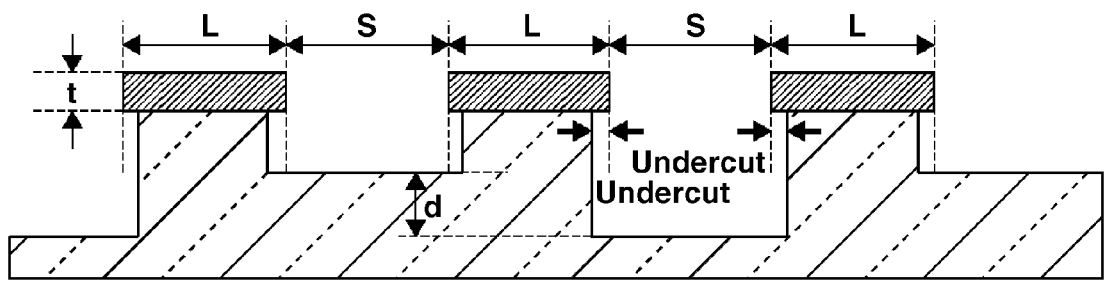
FIG. 19B illustrates an example phase shift mask having a dual trench structure.
Figure 19C:
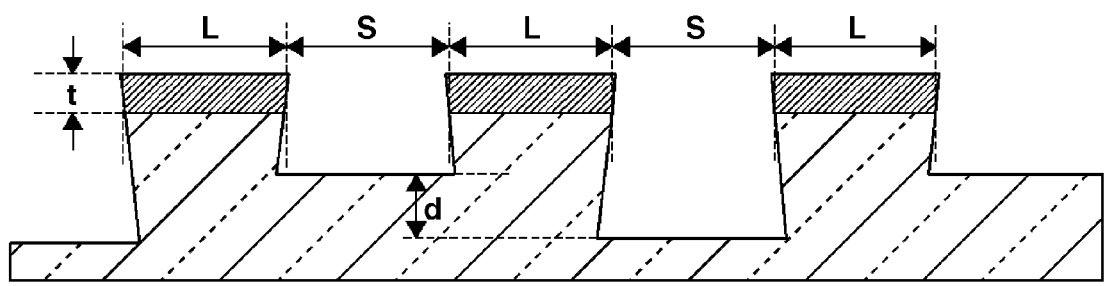
FIG. 19C illustrates an example phase shift mask having a dual trench structure.

The above-descried structure is also applicable to a dual trench structure illustrated in FIG. 19C. A general dual trench structure has a cross-sectional shape illustrated in FIG. 19A. One of two neighboring transmissive regions provided at both sides of a chrome film is deeper than the other of the neighboring transmissive regions, so that a phase difference is set between two transmissive regions.

The dual trench structure does not require a bias ("abias") that sets a dimensional difference effective only for one of transmissive regions, because both of two neighboring transmissive regions are trenched. Furthermore, it is desired to add a "sbias" equivalent to an undercut illustrated in FIG. 19B. However, it is difficult to increase the "sbias" due to structural restrictions.

Similar to the single trench structure, TE polarized light has large 1st-order diffraction efficiency when the thickness (t(nm)) of the absorber is large. When the side wall angle is a negative value (when the taper is a negative taper) as illustrated in FIG. 19C, the TE polarized light has large 1st-order diffraction efficiency and small 0th-order diffraction efficiency. However, compared to the single trench structure, increasing the angle of a negative taper is difficult due to structural restrictions. Therefore, to improve the 1st-order diffraction efficiency of TE polarized light, it is desired to adjust the thickness (t(nm)) of the absorber to be a larger value.

The structure illustrated in FIG. 4A can be replaced with another single trench structure illustrated in FIG. 4B or FIG. 4C. When the side wall angle (taper) is negative, similar effects can be obtained by providing a protrusion such as a step along an inclined line on a transparent substrate or a absorber. The stepped portion can be provided on an absorber or on a transparent substrate. Furthermore, the above-described structure can be applied to the dual trench structure.

An ordinary manufacturing method can be used for the mask illustrated in FIG. 4A. For example, the ordinary manufacturing method includes determining a region of the absorber "m" by dry etching and letting the dry etching advance in the depth direction of the transparent substrate "SUB". The method includes controlling etching conditions to determine the taper shape (angle).

FIG. 4B illustrates a stepped structure realizing an inclination comparable to that of the tapered structure illustrated in FIG. 4A. FIG. 4C illustrates another stepped structure realizing an inclination comparable to that of the tapered structure illustrated in FIG. 4B without the tapered or stepped structure of the absorber and capable of improving the 1st-order diffraction efficiency of TE polarized light.

An example method for forming the structure illustrated in FIG. 4C includes applying dry etching to a substrate to form a first step, next performing wet etching to form a second step, and finally performing dry etching to partly remove a light-blocking film. A similar method can be used to form an absorber having a stepped structure. Another method for forming an absorber includes forming two-layered films by vacuum deposition, such as for example sputtering.

The following is the reason why the phase shift masks illustrated in FIG. 3A, FIG. 3B, and FIGS. 4A through 4C are ideal in their cross-sectional structures. An exemplary embodiment performs electromagnetic field analysis on a three-dimensional structure of a mask that is accurately reproduced to obtain light diffracted by the mask when TE polarized light and TM polarized light having the same energy are input to the mask. However, when polarized light illumination is used, the light entering a mask includes almost TE polarized light. Therefore, in exposure, an actual ratio between TE polarized light of diffracted light and TM polarized light of diffracted light is not identical to the value obtained by the electromagnetic field analysis.

An exemplary embodiment obtains diffracted light (efficiency) of TE polarized light and diffracted light (efficiency) of TM polarized light for each diffraction angle. The amplitude and the phase of each diffracted light have important roles on image formation. The 0th-order light vertically entering a mask and advancing straight does not contribute to image formation of a pattern. When a fine pattern is used, 1st-order light is largest in percentage and has an important role on image formation of the pattern. On the other hand, higher-order light having a larger diffraction angle does not pass through the inside of an optical system and, therefore, does not contribute to image formation of the pattern.

In 1st-order diffracted light, 1st-order diffracted light of TE polarized light has strong interferential properties and contributes to fine image formation of a pattern. However, when the diffraction angle is close to 90 degrees, 1st-order diffracted light of TM polarized light has weak interferential properties and does not contribute to fine image formation of a pattern. Accordingly, the percentage of 1st-order diffracted light of TE polarized light relative to the entire intensity of diffracted light is an important factor.

The 0th-order diffracted light becomes zero in scalar diffraction when the period of an L/S periodic pattern in which the line width and space width are equal is infinite. However, the 0th-order diffracted light does not become zero when a three-dimensional structure of a mask is taken into consideration.

Particularly, the 0th-order diffracted light not only becomes uniform background (noise) light but deteriorates image performances with respect to aberration of a projection optical system (particularly, defocus). In a defocus state, interference between 1st-order diffracted light and 0th-order diffracted light causes a large phase difference.

The mask having a cross-sectional structure illustrated in FIG. 3A, FIG. 3B, FIG. 4A, FIG. 4B, or 4C can reduce 0th-order diffracted light of TE polarized light and can improve the 1st-order diffracted light efficiency of TE polarized light. The following is a result of simulation performed under predetermined conditions. To form an image having a pitch of 90 nm and a line width L of 32 nm on a wafer with an exposure apparatus having a wavelength of ArF (193 nm) and NA=1.35, a phase shift mask used in the simulation has a pitch of 360 nm and a line width L of 128 nm as pattern dimensions on a 4× mask. The absorber (chrome) thickness is set to 103 nm.

FIG. 5A illustrates the ratio in amplitude between 0th-order diffracted light of TE polarized light and 1st-order diffracted light of TE polarized light incident on a projection optical system, which is obtained by simulation. FIG. 5B illustrates the ratio in amplitude between 1st-order diffracted light of TE polarized light and 1st-order diffracted light of TM polarized light incident on a projection optical system, which is obtained by simulation.

In FIG. 5A, the abscissa axis indicates "undercut" and the ordinate axis indicates the ratio in amplitude between 0th-order diffracted light of TE polarized light and 1st-order diffracted light of TE polarized light for each value of parameter "bias." As described above, it is desirable that the 0th-order diffracted light of TE polarized light is small.

According to a conventional correction using only the undercut to "0/π difference", if the undercut is increased, the ratio of 0th-order diffracted light of TE polarized light to 1st-order diffracted light of TE polarized light becomes smaller. However, it is difficult to provide an undercut of 60 nm when the line width is 128 nm.

When the bias is increased, the ratio of 0th-order diffracted light of TE polarized light to 1st-order diffracted light of TE polarized light can be minimized at bias=−45 nm and undercut=10 nm.

In FIG. 5B, the abscissa axis indicates "undercut" and the ordinate axis indicates the ratio in amplitude between 1st-order diffracted light of TE polarized light and 1st-order diffracted light of TM polarized light for each value of parameter "bias." It is desired that 1st-order diffraction efficiency of TE polarized light is larger than 1st-order diffraction efficiency of TM polarized light. In other words, it is desired that the ratio between them is large.

If the undercut is increased, the ratio of 1st-order diffraction efficiency of TE polarized light to 1st-order diffracted light of TM polarized light becomes smaller. If the bias is increased and the undercut is reduced, the ratio of 1st-order diffraction efficiency of TE polarized light to 1st-order diffracted light of TM polarized light becomes larger. In FIG. 5A and FIG. 5B, a circle indicates an appropriate combination of "bias" and "undercut" and a triangle indicates a conventional undercut (=60, bias=0). As understood from FIGS. 5A and 5B, both the 0th-order diffracted light efficiency and the 1st-order diffracted light efficiency of TE polarized light change when "undercut" and "bias" (parameters defining a mask structure) change. These changes bring the following effects on image performance.

Figure 25A:
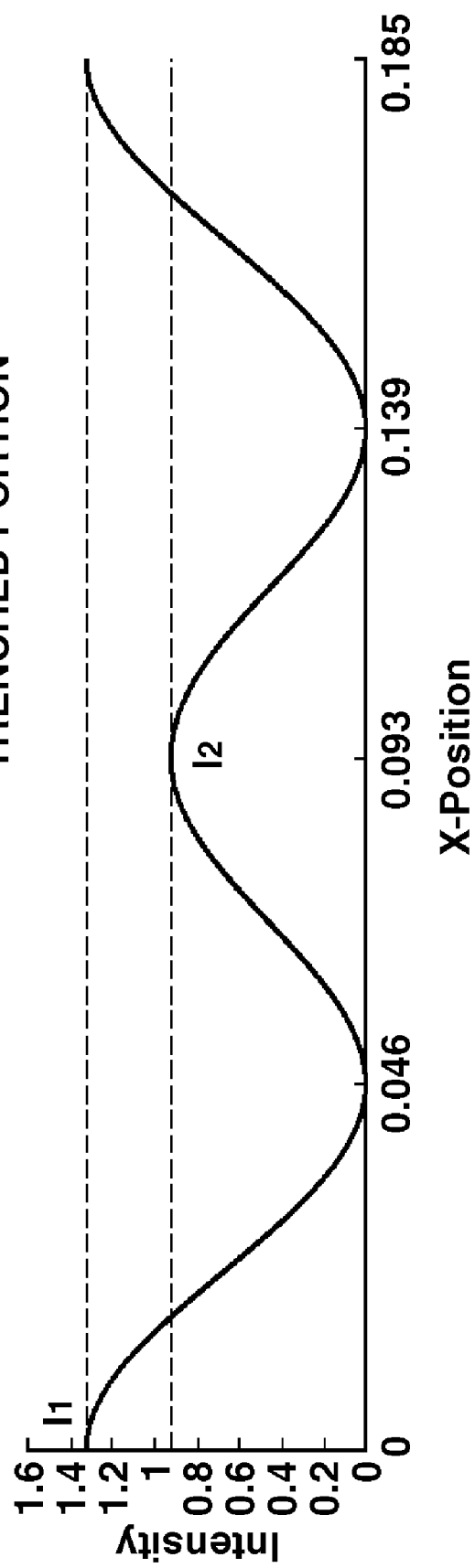
FIG. 25A illustrates a phenomenon caused by "0/π difference."

An exemplary embodiment calculates a distribution of image intensity based on the TE polarized light illumination. To simplify the description, a simulation can be performed for forming an image by inputting diffracted light of TE polarized light only into a projection optical system. In the distribution of image intensity, due to the "0/π difference", a peak value difference in intensity of light appears between a trench and a non-trench region as illustrated in FIG. 25A. The difference tends to become larger due to "defocus." An exemplary embodiment obtains a peak difference (I1−I2) in intensity of light by changing "defocus" and obtains the width of change amount Δ(I1−I2) in an allowable depth of focus.

FIG. 6A illustrates a result. In FIG. 6A, the abscissa axis indicates "undercut" and the ordinate axis indicates the width of change amount Δ(I1−I2) that represents a difference in peak intensity in an allowable depth of focus for each value of parameter "bias."

According to the conventional correction using the "undercut" only, when the "undercut" is increased, the width Δ(I1−I2) becomes smaller. However, the width Δ(I1−I2) is a large at bias=0 and undercut=60 nm. A triangle indicates a combination of "bias" and "undercut" according to a conventional structure.

If the "bias" is increased in the negative direction, the width Δ(I1−I2) can be minimized at bias=−40 nm and undercut=10 nm. This is referred to as an optimum structure (defined by optimum values of "bias" and "undercut"). A circle indicates a combination of "bias" and "undercut" defining the optimum structure.

Figure 25B:
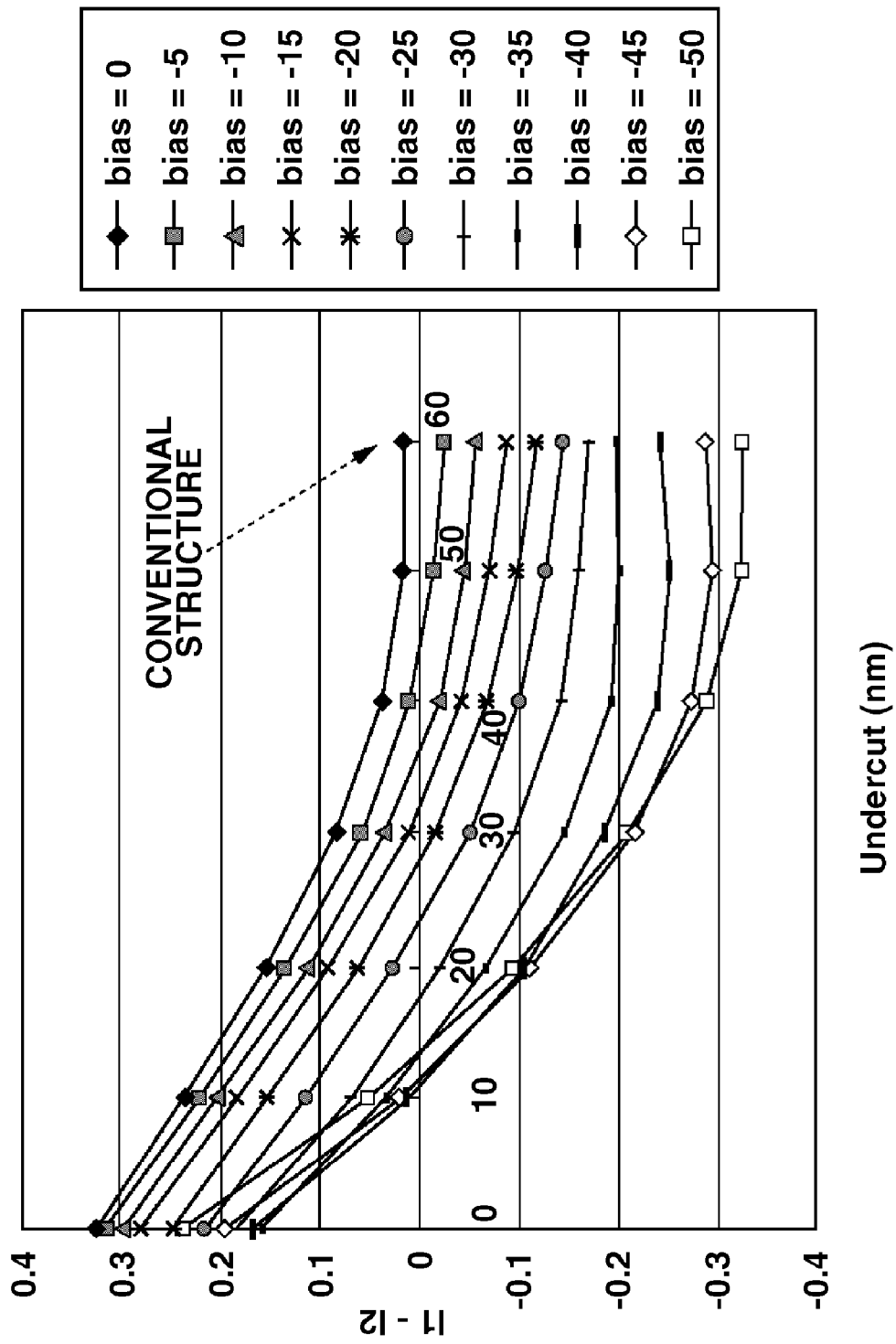
FIG. 25B illustrates relationships between "undercut" and peak difference (I1–I2) in intensity of light.

In these combinations, (I1−I2) at best focus is close to zero as understood from FIG. 25B. In addition, it is understood from FIG. 6A that a change amount in the allowable depth of focus (namely, deterioration by defocus) is small.

Accordingly, compared to the rate of 0th-order diffracted light of TE polarized light illustrated in FIG. 5A, it is understood that, when the rate of 0th-order diffracted light is small, the difference in light intensity peak value is small in the entire region of an allowable depth of focus.

Next, an exemplary embodiment obtains a CD change in response to 1% variation in polarization degree RoP. The polarization degree RoP is a ratio of the intensity of linear polarized light in any direction relative to the entire intensity. An exemplary embodiment performs an image intensity distribution by using a reference polarized light illumination that sets, as polarization degree, a rate of TE polarized light relative to the entire intensity to 95%, and obtains a CD change by performing an image intensity distribution using a polarized light illumination corresponding to 1% variation in polarization degree.

If the polarization degree is equal to or greater than 90%, the polarized light can be regarded as desired linear polarized light. As the reference polarization degree is dependent on each exposure apparatus, 95% is not an important numerical value. The reference polarization degree is set to, for example, 93% or 98%. When the polarization degree RoP is equal to or greater than 90%, the CD change responsive to 1% variation in polarization degree remains almost the same.

FIG. 6B illustrates a result. When the undercut is small, the CD change is small. It is desired that the CD change remains as a small value irrespective of variations in polarization degree RoP. Accordingly, compared to the result illustrated in FIG. 5B, it is understood that the CD change is small irrespective of variations in polarization degree when the efficiency of 1st-order diffracted light of TE polarized light is large.

As described above, an optimum structure can be obtained when 0th-order diffracted light of TE polarized light is minimized and the ratio in amplitude between 1st-order diffracted light of TE polarized light and 1st-order diffracted light of TM polarized light is large. As a result of consideration, it is understood that a desired ratio in amplitude between 1st-order diffracted light of TE polarized light and 1st-order diffracted light of TM polarized light is equal to or greater than 1, alternatively, more than 1.1 or 1.2.

Furthermore, an example embodiment performs a simulation with respect to thin line width. To form an image having a pitch of 74 nm and a line width L of 26 nm on a wafer with an exposure apparatus having a wavelength of ArF (193 nm) and NA=1.35, a phase shift mask used in the simulation has a pitch of 296 nm and a line width L of 104 nm as pattern dimensions on a 4× mask. The absorber (chrome) thickness is set to 103 nm.

FIG. 7A illustrates the ratio in amplitude between 0th-order diffracted light of TE polarized light and 1st-order diffracted light of TE polarized light. FIG. 7B illustrates the ratio in amplitude between 1st-order diffracted light of TE polarized light and 1st-order diffracted light of TM polarized light.

In FIG. 7A, the abscissa axis indicates "undercut" and the ordinate axis indicates the ratio in amplitude between 0th-order diffracted light of TE polarized light and 1st-order diffracted light of TE polarized light for each value of parameter "bias." In FIG. 7B, the abscissa axis indicates "undercut" and the ordinate axis indicates the ratio in amplitude between 1st-order diffracted light of TE polarized light and 1st-order diffracted light of TM polarized light for each value of parameter "bias."

According to the above-described conditions, the 0th-order diffracted light of TE polarized light is minimized at bias=−50 nm and undercut=20 nm as illustrated in FIG. 7A. In this case, the ratio of 1st-order diffracted light of TE polarized light to 1st-order diffracted light of TM polarized light is less than 1 as illustrated in FIG. 7B. More specifically, the 1st-order diffraction efficiency of TM polarized light is larger than the 1st-order diffraction efficiency of TE polarized light.

Figure 8A:
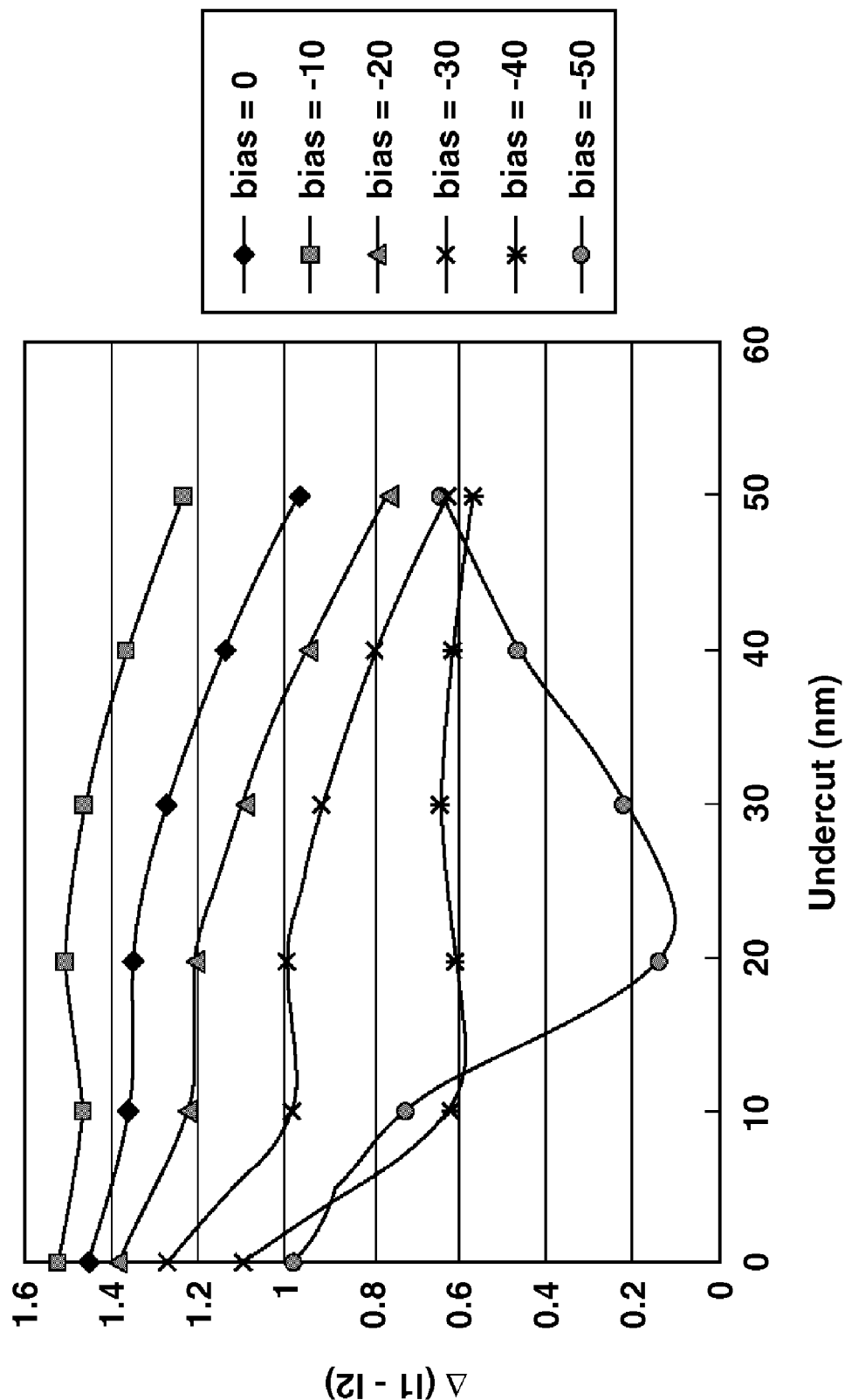
FIG. 8A illustrates example relationships between "undercut" and the width of change amount Δ(I1–I2) that represents a difference in peak intensity in an allowable depth of focus.

Furthermore, an example embodiment obtains the width of change amount Δ(I1−I2) that represents a difference between a peak intensity at a trench and a peak intensity at a non-trench region in the allowable depth of focus and obtains CD changes corresponding to 1% variation in polarization degree RoP. The result illustrated in FIGS. 8A and 8B can suggest the following.

Under these conditions, the 0th-order diffracted light of TE polarized light is minimized at bias=−50 nm and undercut=20 nm (a circle in FIG. 7A indicates this combination of "bias" and "undercut"). In this case, although the width of change amount Δ(I1−I2) representing a peak difference in the allowable depth of focus is minimized, the CD change corresponding to 1% variation in polarization degree exceeds 0.15 nm.

Although the line width is small and the CD control becomes difficult, a CD change may occur even if the polarization degree slightly changes.

Therefore, an exemplary embodiment changes the three-dimensional structure of the mask and checks the depth of a trench, the thickness of an absorber, and side wall angles of a glass substrate and the absorber and configures the mask structure into the shapes illustrated in FIGS. 4A through 4C. Thus, the 0th-order diffracted light of TE polarized light can be minimized and the ratio of the 1st-order diffraction efficiency of TE polarized light to the 1st-order diffraction efficiency of TM polarized light becomes larger than 1.

The 0th-order diffracted light of TE polarized light becomes smaller if the trench angle satisfies the following relationship:

$$(170/180)\lambda/2(n-1) \leq d \leq \lambda/2(n-1).$$

However, in general, when the line width is small even if the pitch is large, a structure capable of reducing 0th-order diffracted light of TE polarized light reduces the ratio in amplitude between 1st-order diffracted light of TE polarized light and 1st-order diffracted light of TM polarized light to less than 1. In particular, when the thickness of an absorber is small, the diffraction efficiency of 1st-order diffracted light of TE polarized light deteriorates.

As discussed in Japanese Patent Application Laid-Open No. 2005-182031 (corresponding to U.S. Patent Application Publication No. 2005/0136334), the diffraction efficiency of TE polarized light can be improved by increasing the thickness of an absorber. However, an absorber layer thickness "t" larger than the wavelength λ is difficult to realize for a fine structure equivalent to or less than the wavelength λ. Hence, an exemplary embodiment obtains an optimum structure by checking diffraction efficiencies of 0th-order and 1st-order diffracted light of TE polarized light in a range where the absorber layer thickness "t" is less than the wavelength λ, while changing the taper angle of each side wall of the glass substrate and the absorber.

First, an exemplary embodiment checks diffraction efficiencies of 0th-order and 1st-order diffracted light of TE polarized light with respect to a conventional undercut of 50 nm having no bias, while changing the absorber layer thickness "t" and the taper angle of each side wall of the glass substrate and the absorber. The side wall taper angle (inclination angle) of the glass substrate is set to be equal to the side wall taper angle of the absorber.

Figure 9A:
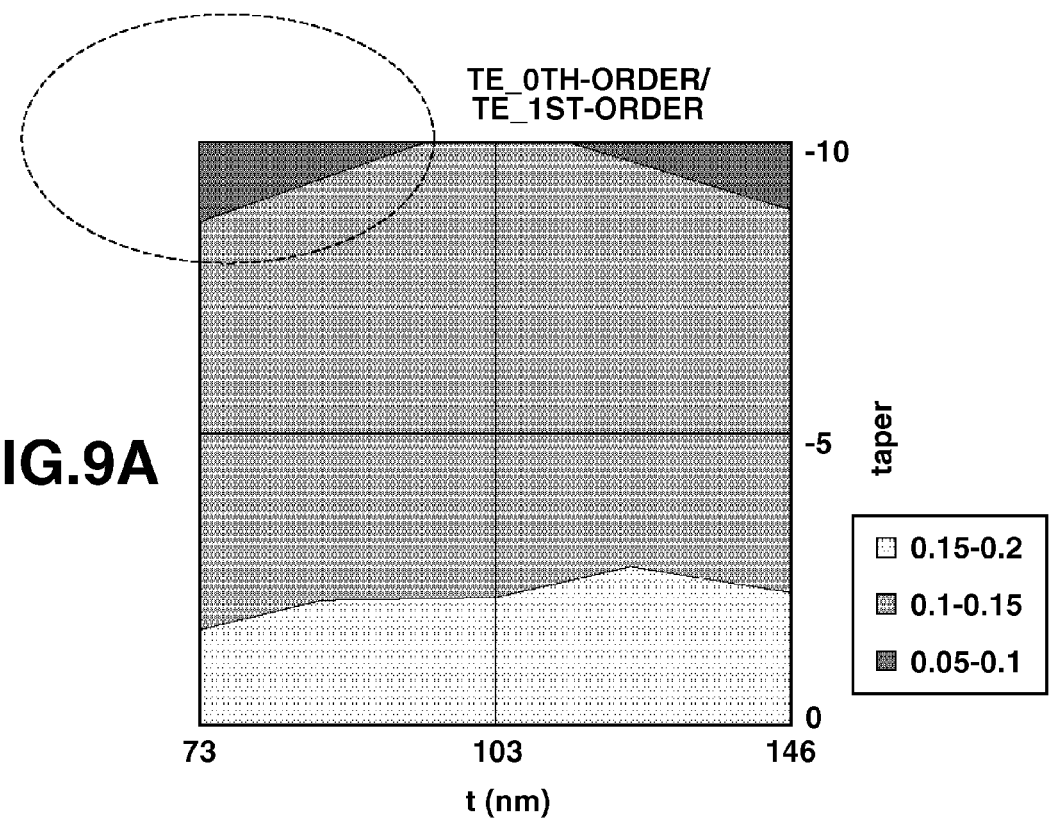
FIG. 9A is a contour map illustrating the ratio in amplitude between 0th-order diffracted light of TE polarized light and 1st-order diffracted light of TE polarized light in relation to absorber thickness "t" and "taper."
Figure 9B:
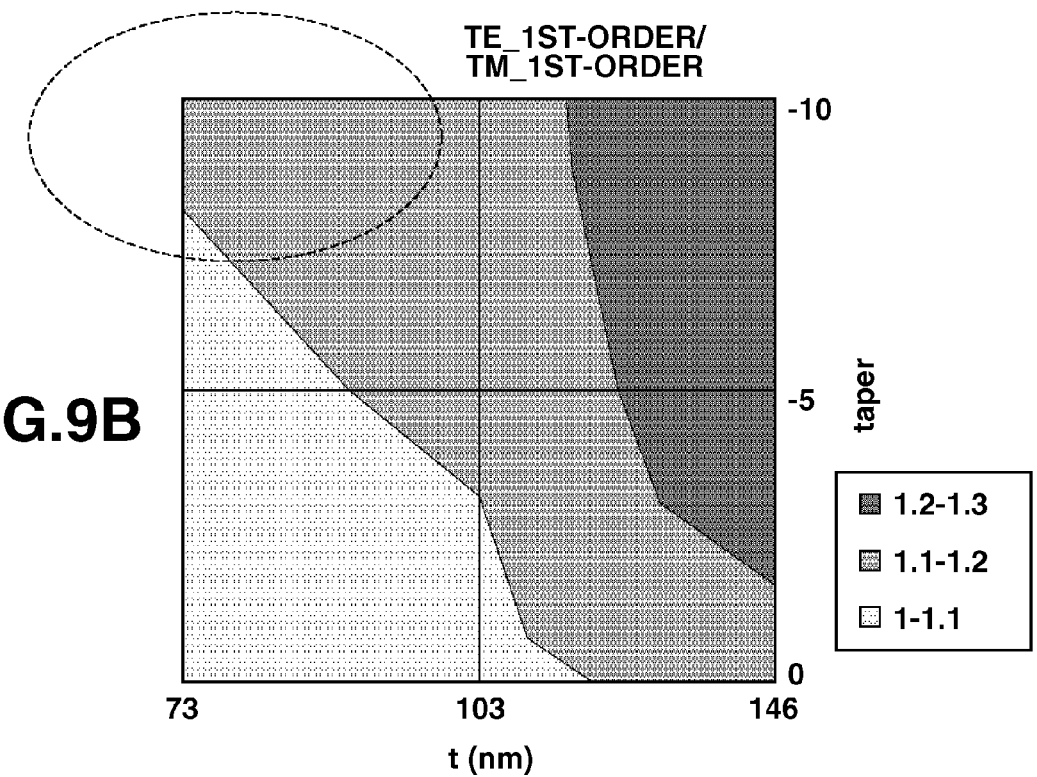
FIG. 9B is a contour map illustrating the ratio in amplitude between 1st-order diffracted light of TE polarized light and 1st-order diffracted light of TM polarized light in relation to absorber thickness "t" and "taper."

FIG. 9A is a contour map illustrating the ratio in amplitude between 0th-order diffracted light of TE polarized light and 1st-order diffracted light of TE polarized light, in which the abscissa axis indicates the absorber layer thickness "t" and the ordinate axis indicates the taper angle. FIG. 9B is a contour map illustrating the ratio in amplitude between 1st-order diffracted light of TE polarized light and 1st-order diffracted light of TM polarized light, in which the abscissa axis indicates the absorber layer thickness "t" and the ordinate axis indicates the taper angle. In each map, a dark color portion is a desired portion and an encircled portion indicates an optimum portion common to both maps.

From the results illustrated in FIGS. 9A and 9B, an optimum structure corresponding to bias=0 and undercut=50 nm has dimensions of t=70 to 90 (nm) and taper=−10 (deg.). As described above, realizing the undercut of 50 nm is difficult due to structural restrictions. Therefore, an exemplary embodiment checks similarly on the result illustrated in FIG. 7A about combinations of "bias" and "undercut" capable of reducing 0th-order diffracted light of TE polarized light, while setting bias=−30 nm and undercut=30 nm.

FIG. 10A is a contour map illustrating the ratio in amplitude between 0th-order diffracted light of TE polarized light and 1st-order diffracted light of TE polarized light. FIG. 10B is a contour map illustrating the ratio in amplitude between 1st-order diffracted light of TE polarized light and 1st-order diffracted light of TM polarized light. An encircled portion indicates an optimum portion common to both maps.

When bias=−30 nm and undercut=30 nm, an optimum structure satisfies the following relationship:

$$103 \leq t \leq 146 \text{ (nm) and } -10 \leq taper \leq 0 \text{ (deg.)}.$$

In this condition, an optimum relationship of the absorber thickness (t(nm)) and the side wall angle (taper (deg.)) is as follows:

$$taper \leq 0.15t - 20.0.$$

The above-described structure can reduce the 0th-order diffraction efficiency of TE polarized light and can set the 1st-order diffraction efficiency of TE polarized light to be equal to or greater than 1. It is desired that 0th-order diffracted light of TE polarized light is equal to or less than 0.1 when a mask is a dark field.

In a bright field mask, the amount of 0th-order diffracted light is variable depending on each pattern.

Figure 20:
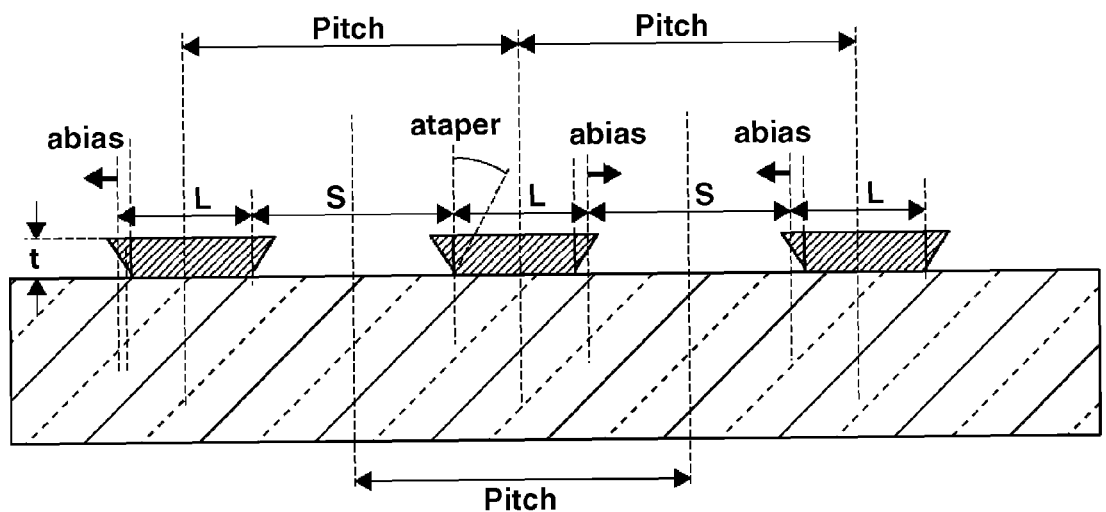
FIG. 20 illustrates an example binary mask or an example halftone mask.
Figure 21:
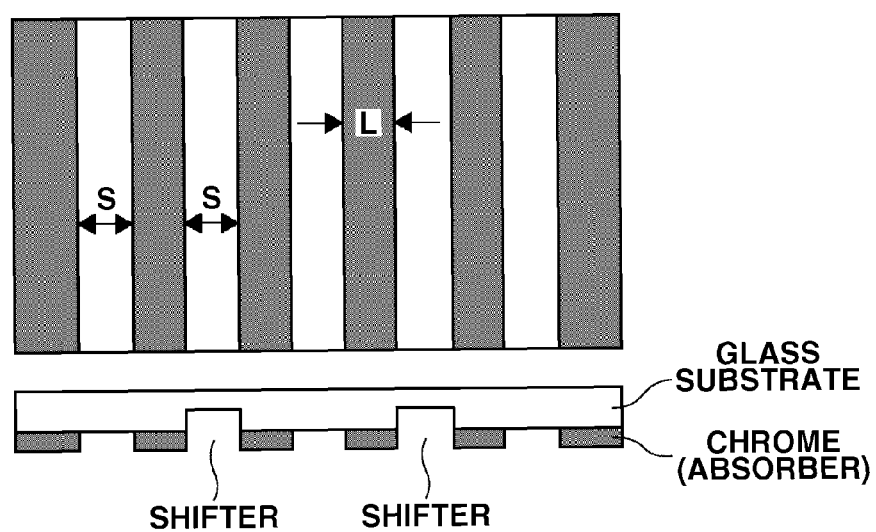
FIG. 21 illustrates an example phase shift mask.
Figure 22:
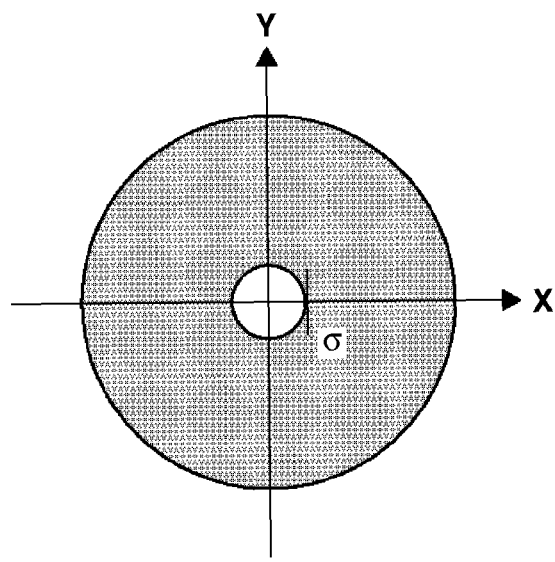
FIG. 22 illustrates an example small σ illumination.
Figure 23:
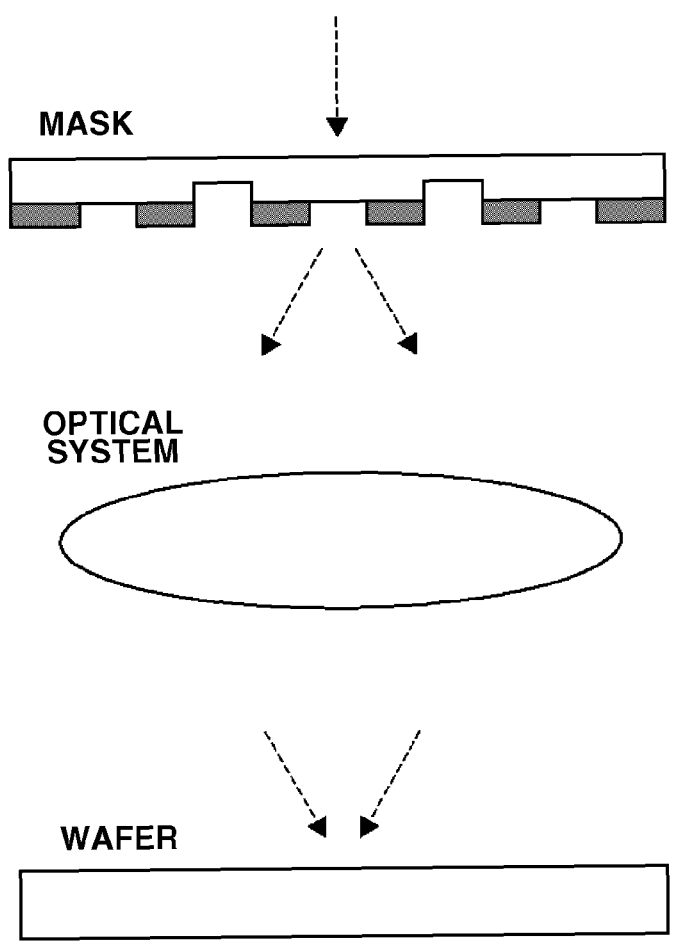
FIG. 23 illustrates an example phase shift mask used for exposure of a wafer.

A phase shift mask is very sensitive to variations in polarization degree if a mask structure has a fine structure equivalent to or less than the wavelength of illumination light due to the "0/π difference" problem. Similar consideration can be applied to a binary mask or a halftone mask. In this case, diffracted light from a mask has a diffraction efficiency capable of increasing the ratio in amplitude between TE polarized light and TM polarized light having the order (0th-order diffracted light and, particularly, 1st-order diffracted light) that gives an effect on the resolution of basic period to 1 or more. Furthermore, it is desired to minimize the diffraction efficiency of higher-order diffracted light that passes through the pupil and does not give an effect on the resolution of basic period. For example, the diffraction efficiency of TE polarized light can be increased if a binary mask or a halftone mask has a structure illustrated in FIG. 20. The halftone mask corresponds to a mask whose absorber "m" is a semi-transmissive film.

As described above, the efficiency of diffracted light (1st-order diffracted light) of TE polarized light that gives an effect on the resolution of basic period is variable according to the cross-sectional structure of a mask. Accordingly, this may cause the "0/π difference" problem or may change the passing amount of linear polarized light in a particular direction.

As a result, the CD accuracy of a pattern on an image plane changes. An exemplary embodiment proposes a mask structure capable of reducing CD error.

However, in designing a mask, the first priority is given to solving the "0/π difference" problem. When a mask structure is designed to solve the "0/π difference" problem, the 1st-order diffraction efficiency of TE polarized light may become smaller than the 1st-order diffraction efficiency of TM polarized light.

If such a mask is used, CD error has higher sensitivity to polarization error. Therefore, an exposure apparatus is required to accurately perform polarization control.

The degree of accuracy in the polarization control depends on CD changes relative to variations in polarization degree and also depends on the 1st-order diffraction efficiency of TE polarized light. The exposure apparatus is required to perform polarization control such that CD error remains within an allowable range. More specifically, in the polarization control, the error in polarization degree is required to be equal to or less than an allowable limit.

An allowable error limit in polarization degree RoP_limit can be obtained by dividing an allowable value CD_RoP_limit (nm) of CD error by CD change (CD_ROP) corresponding to 1% variation in polarization degree, as follows:

$$RoP\_limit = CD\_RoP\_limit/CD\_ROP.$$

When the ratio of the intensity ($I_{TE\_1}$) of 1st-order diffraction efficiency of TE polarized light to the intensity ($I_{TM\_1}$) of 1st-order diffraction efficiency of TM polarized light is large, CD change (CD_ROP) is small, as described above. Therefore, the CD change (CD_ROP) corresponding to 1% variation in polarization degree can be expressed using the ratio of the intensity ($I_{TE\_1}$) of 1st-order diffraction efficiency of TE polarized light to the intensity ($I_{TM\_1}$) of 1st-order diffraction efficiency of TM polarized light.

If $\alpha$ represents the ratio of the intensity ($I_{TE\_1}$) of 1st-order diffraction efficiency of TE polarized light to the intensity ($I_{TM\_1}$) of 1st-order diffraction efficiency of TM polarized light, the following equation defines the ration $\alpha$.

$$\alpha = I_{TE\_1}/I_{TM\_1}.$$

The CD change (CD_ROP) corresponding to 1% variation in polarization degree can be approximated as a function $f(\alpha)$ of the ration $\alpha$.

$$CD\_ROP = f(\alpha).$$

Accordingly, the allowable error limit in polarization degree RoP_limit can be obtained by dividing the allowable limit of CD error CD_RoP_limit (nm) by $f(\alpha)$, as follows:

$$RoP\_limit = CD\_RoP\_limit/f(\alpha).$$

If the error in polarization degree exceeds the allowable error limit in polarization degree RoP_limit, adjusting dose is effective as a method for reducing the CD change.

The following correction formula can be used to correct dose according to a change in polarization degree. When Do represents dose of a reference polarization degree (RoP_reference), the dose can be changed to D according to a measured polarization degree (RoP_measurement). In the following formula, K represents a coefficient determined according to a mask structure.

When the dose is changed according to a mask structure so as to reflect a change in polarization degree, the following first-order approximation expresses the dose D.

$$D = Do/((RoP\_measurement + K(1 - RoP\_measurement))/(RoP\_reference + K \cdot (1 - RoP\_reference)))$$

In the above-described formula, Do represents a dose of the reference RoP (RoP_reference), RoP_measurement represents a measured RoP, and K represents a coefficient determined according to a mask structure.

The coefficient K determined according to a mask structure can be approximated by a product of a function $g(\alpha)$ of the above-described ratio $\alpha$ and a process constant Kp, as follows:

$$K = Kp \cdot g(\alpha)$$

The process constant Kp is variable depending on NA of an exposure apparatus, illumination conditions (determined by shape of effective light source, σ, distribution, reference polarization degree, etc.), a pattern, and other exposure conditions (resist, process, etc.).

As described above, even if there is any change in polarization degree, or even if a large CD change occurs according to a mask structure, CD error can be reduced within an allowable range. For example, an exemplary embodiment can provide a phase shift mask having small CD error sensitivity to variations in polarization state.

Example 1

To form an image having a pitch of 90 nm and a line width L of 32 nm on a wafer with an exposure apparatus having a wavelength of 193 nm (ArF) and NA=1.35, a phase shift mask having a pitch of 360 nm and a line width L of 128 nm as pattern dimensions on a 4× mask was used. In this example, the absorber (chrome) thickness was set to 103 nm, the effective light source illustrated in FIG. 2A was used, and α=0.15 was set.

The structure illustrated in FIG. 3A was used as an optimum mask structure. An optimum structure defined by abias=−45 nm and sbias=10 nm was compared with a conventional structure defined by abias=0 nm and sbias (undercut)=60 nm. The absorber thickness (t(nm)) was set to 73 nm or 103 nm.

Figure 11:
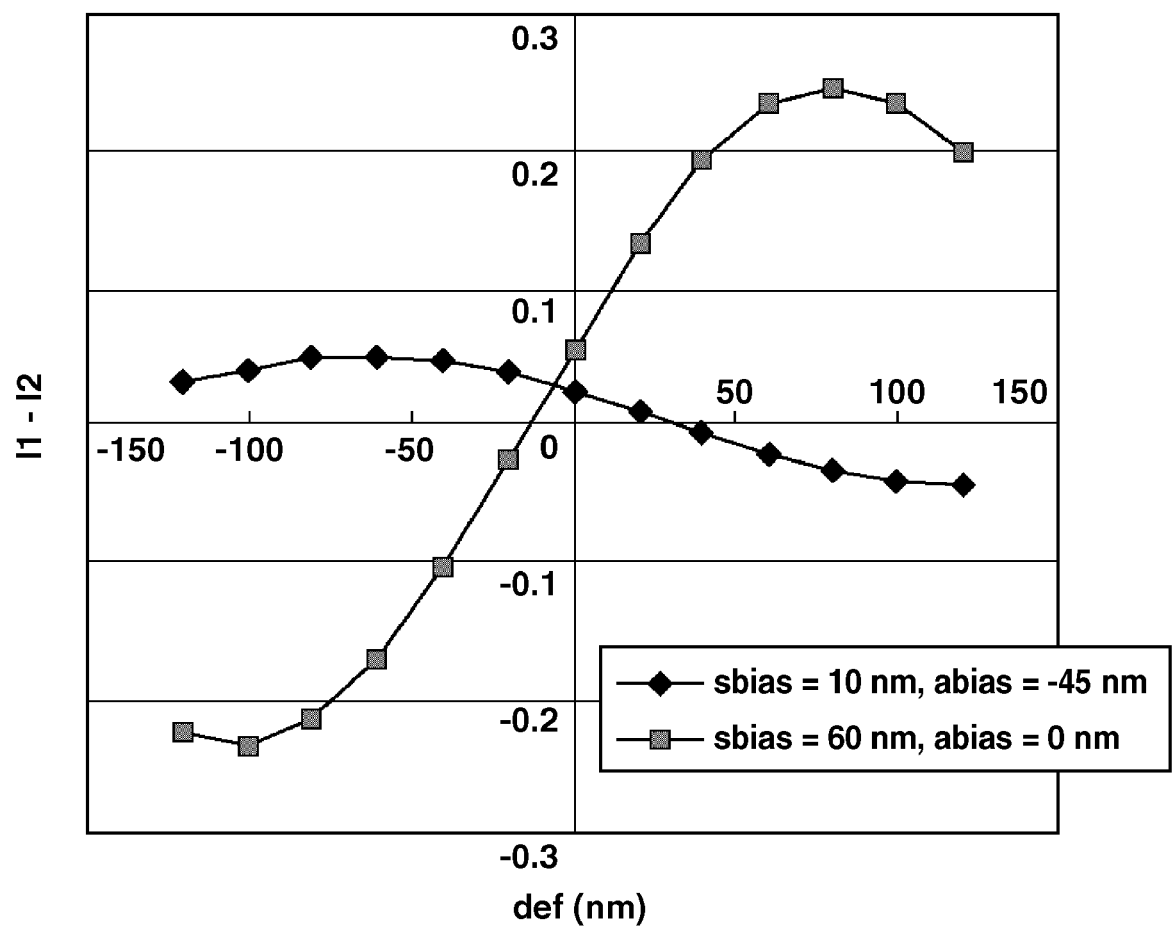
FIG. 11 illustrates example relationships between "defocus" and the width of change amount Δ(I1–I2) that represents a difference in peak intensity in an allowable depth of focus.

First, the peak difference (I1−I2) in intensity of light (refer to FIG. 11) was obtained by changing defocus under a reference polarized light illumination.

It is understood, when the mask has an optimum structure, the peak difference (I1−I2) in intensity of light is small in both a best focus state and a defocus state.

Figure 12:
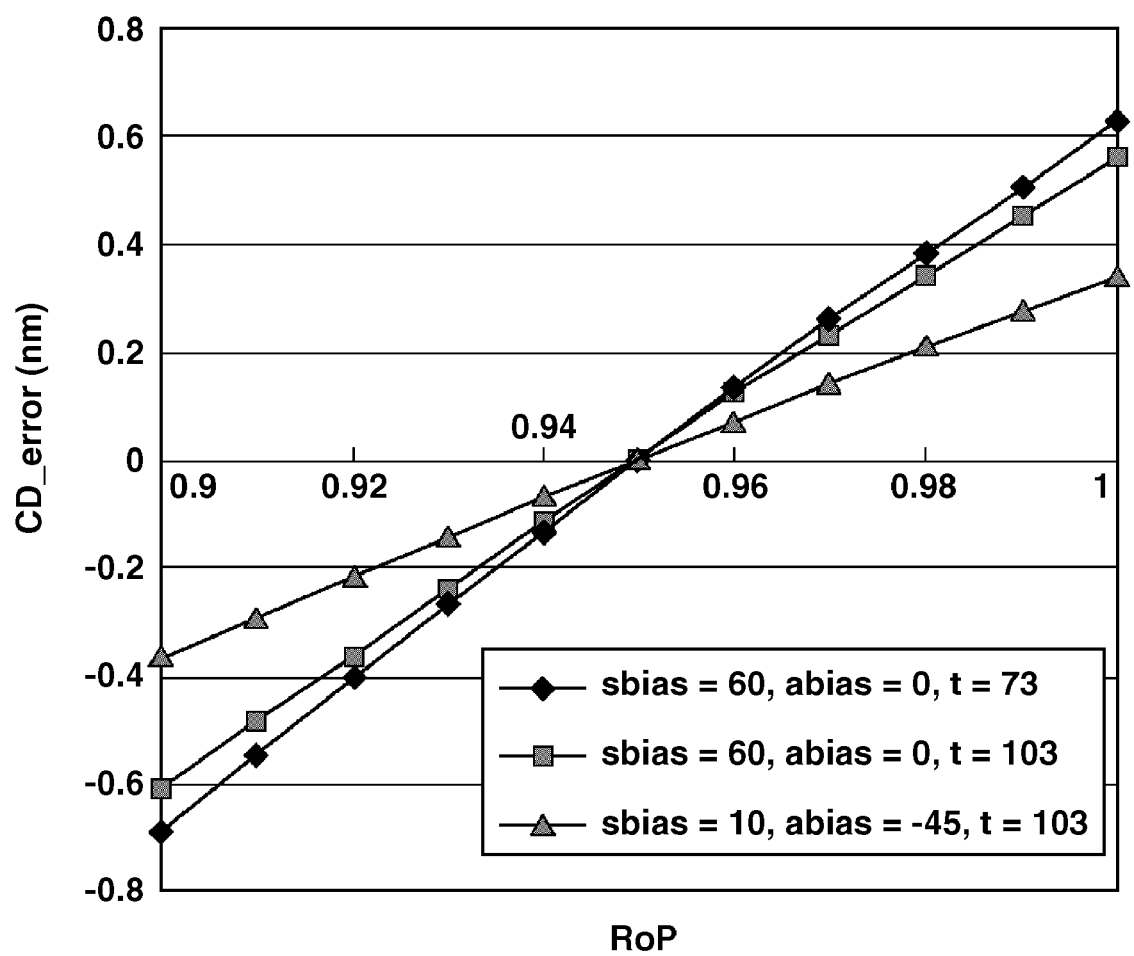
FIG. 12 illustrates example CD changes on an image plane corresponding to variations in polarization degree.

Next, CD changes on an image plane corresponding to variations in polarization degree were obtained while the reference polarization degree was set to 95% (refer to FIG. 12). In FIG. 12, the abscissa axis indicates the polarization degree and the ordinate axis indicates the CD change on an image plane.

Figure 13:
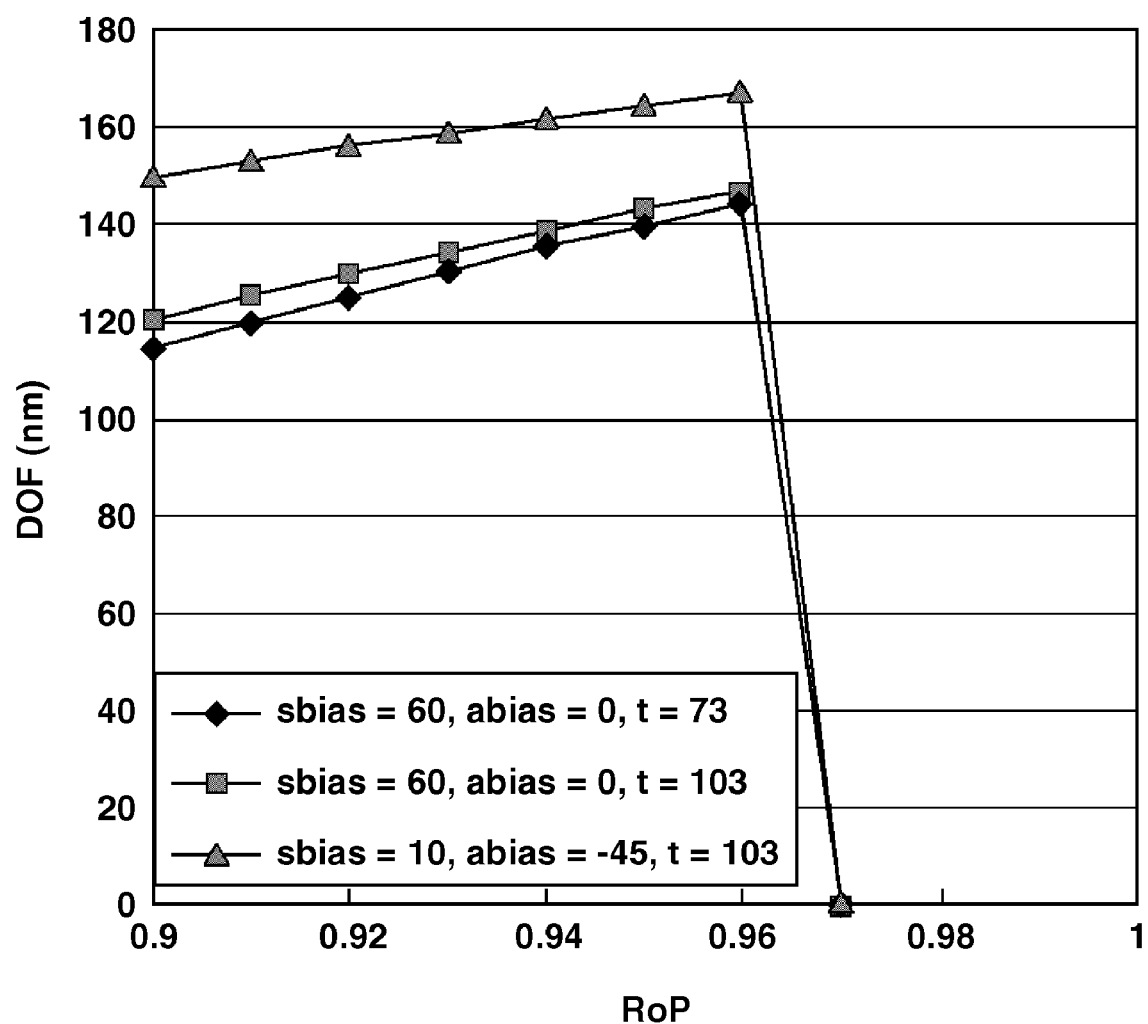
FIG. 13 illustrates example changes in depth of focus on an image plane corresponding to variations in polarization degree.

Furthermore, changes in depth of focus on an image plane corresponding to variations in polarization degree were obtained while the reference polarization degree was set to 95% (refer to FIG. 13). The depth of focus is a defocus width obtained when the CD change allows a variation of ±5% with a predetermined line width L of 32 nm with respect to a variation of 5% in dose. In FIG. 13, the abscissa axis indicates the polarization degree and the ordinate axis indicates a change in depth of focus (DOF).

The CD change corresponding to a polarization degree of ±1% was +0.13 nm according to the conventional structure and ±0.07 nm according to the optimum structure. The change in depth of focus (DOF) was ±3.6% according to the conventional structure and ±1.7% according to the optimum structure.

Compared to the conventional structure, the above-described optimum structure can effectively solve the "0/n difference" problem and can reduce a change corresponding to the polarization degree.

Example 2

To form an image of a pattern having a pitch of 74 nm and a line width L of 26 nm on a wafer with an exposure apparatus having a wavelength of 193 nm (ArF) and NA=1.35, a phase shift mask having a pitch of 296 nm and a line width L of 104 nm as pattern dimensions on a 4× mask was used. In this example, the absorber (chrome) thickness was set to 103 nm, the effective light source illustrated in FIG. 2A was used, and σ=0.15 was set.

The structure illustrated in FIG. 4A was used as an optimum mask structure. The structure illustrated in FIG. 4A is defined by "sbias" (nm), "abias" (nm), absorber thickness (t(nm)), side wall angle (taper (deg.)), and trench depth (d(nm)) satisfying the following equation:

$$d=(\text{phase}/180)\lambda/2(n-1)$$

As evaluation amounts, a variation of the pattern shift corresponding to defocus ±100 nm was indicated and a CD change (CD_error (nm)) and a depth-of-focus change (dDOF (%)) corresponding to 1% variation in polarization degree (RoP) were indicated.

Then, the obtained evaluation amounts were compared with the ratio in amplitude between the 0th-order diffraction efficiency of TE polarized light and the 1st-order diffraction efficiency of TE polarized light or the ratio in amplitude between the 1st-order diffraction efficiency of TE polarized light and the 1st-order diffraction efficiency of TM polarized light. FIG. 14 illustrates a result of comparison.

When the 0th-order diffraction efficiency of TE polarized light is small, an amount of the pattern shift corresponding to the defocus of ±100 nm is small.

When the 1st-order diffraction efficiency of TE polarized light is large, CD change (CD_error(nm)) and depth-of-focus change (dDOF(%)) corresponding to 1% variation in polarization degree (RoP) are small.

Stable exposure performances can be obtained if, in a mask structure, the 0th-order diffraction efficiency of TE polarized light is minimized and the ratio in amplitude between the 1st-order diffraction efficiency of TE polarized light and the 1st-order diffraction efficiency of TM polarized light is equal to or greater than 1 (desirably, greater than 1.1 or 1.2).

In this example, the 1st-order diffraction efficiency of TE polarized light can satisfy the above-described conditions if an absorber thickness (t(nm)) and a side wall angle (taper (deg.)) satisfy the following relationship:

$$\text{taper} \leq 0.15t - 20.0$$

Example 3

As described above, when the line width is small even if the pitch is large, a structure capable of reducing the 0th-order diffraction efficiency of TE polarized light may generally reduce the ratio in amplitude between the 1st-order diffraction efficiency of TE polarized light and the 1st-order diffraction efficiency of TM polarized light to less than 1.

In such a case, CD errors corresponding to variations in polarization degree become larger.

To suppress CD error within an allowable range, this example predicts the level of accuracy required for the control of polarization degree.

To form an image of a pattern having a pitch of 74 nm and a line width L of 26 nm on a wafer with an exposure apparatus having a wavelength of ArF (193 nm) and NA=1.35, a phase shift mask having a pitch of 296 nm and a line width L of 104 nm as pattern dimensions on a 4× mask is used. In this example, the absorber (chrome) thickness is set to 103 nm, the effective light source illustrated in FIG. 2A is used, and σ=0.15 is set. An allowable CD error is set to 0.26 nm, which is equal to 1% of the line width of 26 nm.

If the mask has a lower 1st-order diffraction efficiency of TE polarized light, CD error has higher sensitivity to polarization error. Therefore, an exposure apparatus is required to accurately control polarization.

The level of accuracy in the control of polarization depends on CD changes corresponding to variations in polarization degree and also depends on the 1st-order diffraction efficiency of TE polarized light. The polarization control is required to keep CD error within an allowable range.

It is now assumed that an allowable limit of CD error is equivalent to several % of the line width. The CD change corresponding to variations in polarization degree is variable depending on mask structure. The exposure apparatus is required to change the performance in the polarization degree control according to the mask structure. An exemplary embodiment obtains a ratio $\alpha$ in amplitude (or intensity) between the 1st-order diffraction efficiency of TE polarized light and the 1st-order diffraction efficiency of TM polarized light. An exemplary embodiment obtains a relationship between the amplitude (or intensity) ratio $\alpha$ and the CD change corresponding to a variation in polarization degree.

The following is an example method for obtaining an allowable error in polarization degree corresponding to an allowable CD error.

(1) The method sets an allowable CD error before exposure.

(2) The method obtains a ratio of the 1st-order diffraction efficiency of TE polarized light to the 1st-order diffraction efficiency of TM polarized light.

For example, it is possible to measure the ratio in intensity between the 1st-order diffraction efficiency of TE polarized light and the 1st-order diffraction efficiency of TM polarized light. A mask having the above-described intensity ratio can be experimentally obtained beforehand by changing the polarization degree to measure the CD change.

A general method for measuring the intensity of diffracted light (e.g. diffraction grating) can be used for the measurement of the intensity of 1st-order diffracted light. It is desirable that the wavelength of a laser beam used for the measurement of intensity is similar to the wavelength of exposure light. The diffraction angle of 1st-order diffracted light can be measured in the vicinity of a diffraction angle obtained by the minimum pitch that requires higher CD accuracy. An exemplary embodiment measures the intensity of 1st-order diffracted light both when the polarized light of a laser beam is TE polarized light and when the polarized light of a laser beam is TM polarized light having the same amount of light.

An exemplary embodiment calculates the ratio in intensity (or amplitude) between the 1st-order diffraction efficiency of TE polarized light and the 1st-order diffraction efficiency of TM polarized light based on physical properties of the mask.

(3) Then, the method estimates a relationship between the intensity (or amplitude) ratio and the CD change corresponding to a variation in polarization degree by calculation or experiment.

The following is an exemplary embodiment applied to an exposure apparatus.

Before exposure, an exemplary embodiment sets an allowable CD error and inputs such information to an exposure apparatus. Next, the exemplary embodiment inputs information relating to the ratio in intensity (or amplitude) between 1st-order diffracted light of TE polarized light and 1st-order diffracted light of TM polarized light of a mask to be used for exposure, or reads information relating to the mask.

A control unit of the exposure apparatus determines an upper-limit of error in polarization degree so that CD error can be suppressed within an allowable range.

After setting an allowable CD error, the control unit determines an error of polarization degree so that CD error can be suppressed within an allowable range. If the determined value is larger than a standard value of the polarization degree being set in the exposure apparatus, the control unit performs ordinary exposure processing. If the determined value is smaller than the standard value of the polarization degree, the control unit generates a warning. The exposure apparatus performs appropriate control to suppress CD error within an allowable range.

For example, the exposure apparatus strictly performs polarization degree control, measures illumination light before or during exposure processing, measures the polarization degree of light illuminating a wafer, or adjusts the dose according to a deviation from a reference polarization degree.

Figure 15:
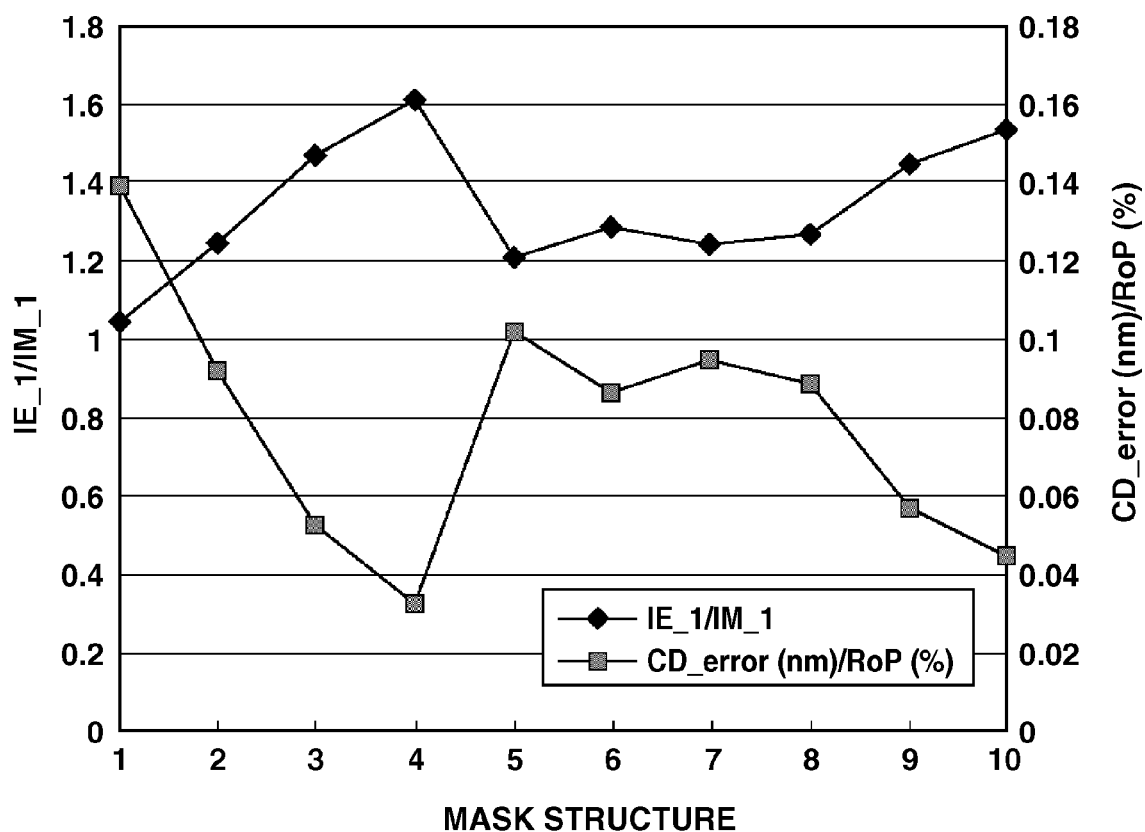
FIG. 15 illustrates the ratio in intensity between 1st-order diffraction efficiency of TE polarized light and 1st-order diffraction efficiency of TM polarized light, and CD change (nm) corresponding to 1% variation in polarization degree.

Example 3 includes the following numerical values. FIG. 15 illustrates the ratio in intensity between the 1st-order diffraction efficiency of TE polarized light and the 1st-order diffraction efficiency of TM polarized light, and CD change (nm) corresponding to 1% variation in polarization degree, based on a total of ten mask structures obtained in example 2 under exposure conditions described in example 2.

In FIG. 15, the abscissa axis indicates the number allocated to each mask structure listed in the table of FIG. 14, the left ordinate axis indicates the ratio in intensity between 1st-order diffracted light of TE polarized light and 1st-order diffracted light of TM polarized light, and the right ordinate axis indicates the CD change corresponding to 1% variation in polarization degree (CD_RoP=CD error/RoP).

From the result illustrated in FIG. 15, it is understood that the CD change corresponding to 1% variation in polarization degree is small when the ratio in intensity between 1st-order diffracted light of TE polarized light and 1st-order diffracted light of TM polarized light is large.

Figure 16:
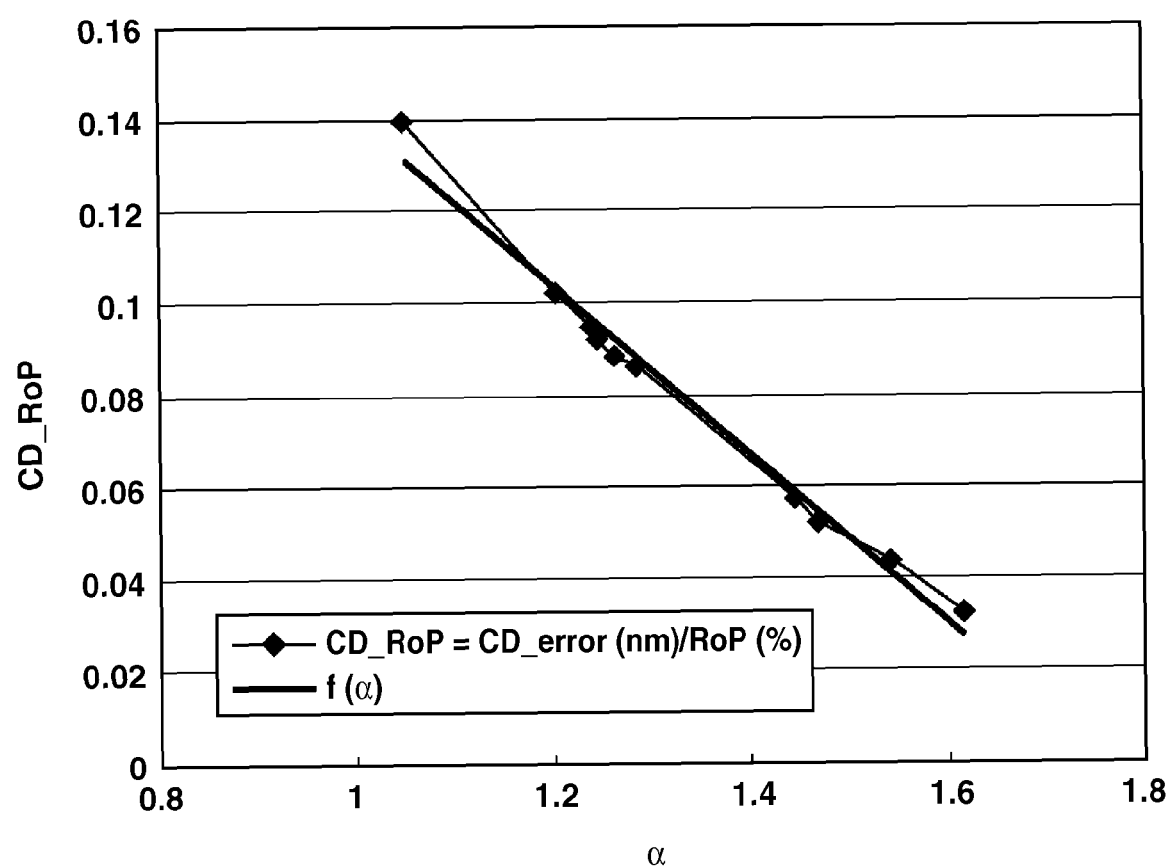
FIG. 16 illustrates the ratio α in intensity between 1st-order diffraction efficiency of TE polarized light and 1st-order diffraction efficiency of TM polarized light, CD error CD_error/ROP, and function f(α).

Next, the exemplary embodiment obtains f($\alpha$) by fitting $\alpha$ to the CD change (CD_RoP) corresponding to 1% variation in polarization degree, where $\alpha$ represents the ratio of the intensity ($I_{TE\_1}$) of 1st-order diffraction efficiency of TE polarized light to the intensity ($I_{TM\_1}$) of 1st-order diffraction efficiency of TM polarized light as illustrated in FIG. 16. In FIG. 16, the abscissa axis indicates $\alpha$ and the ordinate axis indicates function f($\alpha$) obtained based on the mask structures listed in the table of FIG. 14. For comparison, FIG. 16 illustrates CD change (CD_RoP) corresponding to 1% variation in polarization degree that is obtained beforehand. As apparent from FIG. 16, the exemplary embodiment can use polynomial approximation for fitting the function f($\alpha$) to the CD change (CD_RoP) corresponding to 1% variation in polarization degree. A quadratic function or a linear function can be also used for the approximation.

The following formula expresses f($\alpha$) defined according to above-described exposure conditions.

$$CD\_RoP = CD\_\text{error}/RoP = f(\alpha)$$

$$\alpha = I_{TE\_1}/I_{TM\_1}$$

$$f(\alpha) = -0.1831\alpha + 0.3228.$$

An allowable limit of CD error CD_RoP_limit (nm) is 0.26 nm, which is equal to 1% of the line width (26 nm). Dividing the allowable limit of CD error CD_RoP_limit (nm) by CD change (CD_RoP) corresponding to 1% variation in polarization degree obtains the allowable error limit in polarization degree RoP_limit. Furthermore, dividing the allowable limit of CD error CD_RoP_limit (nm) by f($\alpha$) obtains the allowable error limit in polarization degree RoP_limit.

$$RoP\_limit = CD\_RoP\_limit/CD\_RoP$$

$$RoP\_limit = CD\_RoP\_limit/f(\alpha)$$

Figure 17:
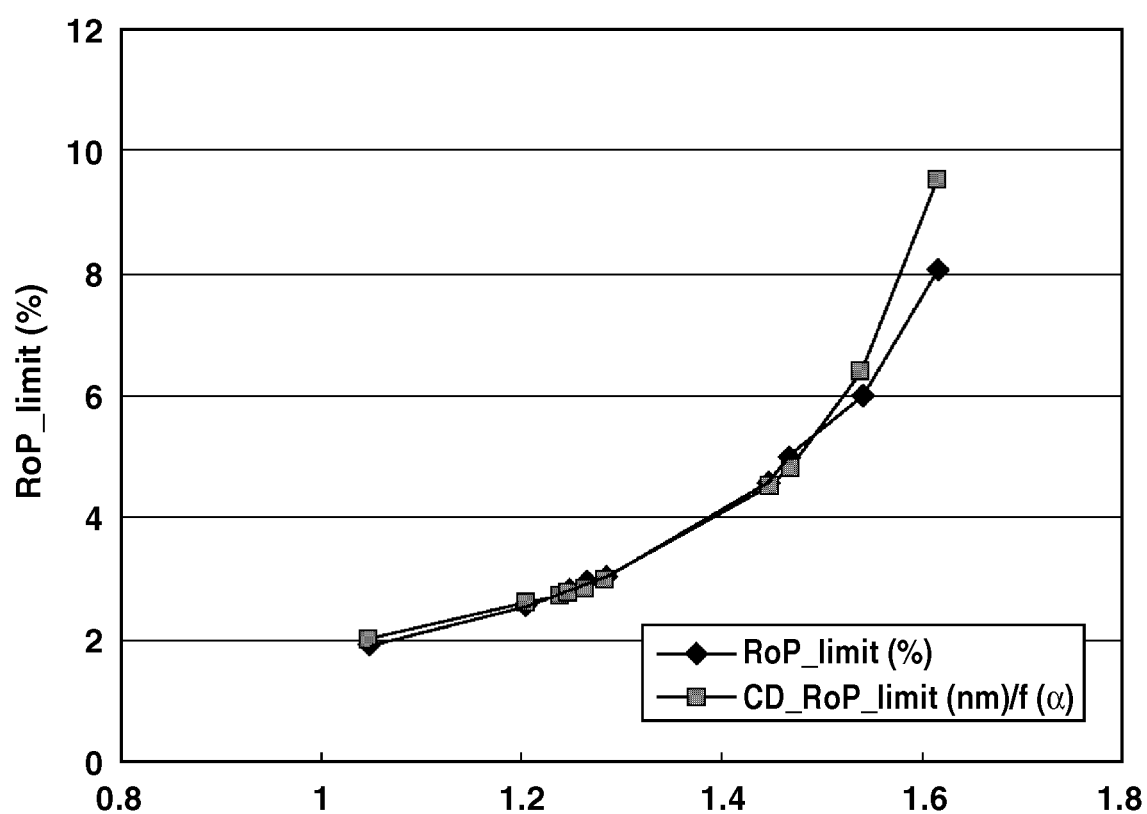
FIG. 17 illustrates CD_RoP_limit/f(α) and RoP_limit corresponding to ratio α.

FIG. 17 illustrates a comparison between the allowable error limit in polarization degree RoP_limit and the allowable limit of CD error CD_RoP_limit (nm) divided by f($\alpha$). In FIG. 17, the abscissa axis indicates a and the ordinate axis indicates the allowable error limit in polarization degree RoP_limit.

The result illustrated in FIG. 17 reveals that the allowable limit of CD error CD_RoP limit (nm)/f(α) appropriately approximates the allowable error limit in polarization degree RoP_limit.

From the above-described results, if an exposure apparatus has a requirement error in polarization degree equivalent to 11%, as the allowable error limit in polarization degree RoP_limit is larger than 1%, the CD change occurring during exposure does not exceed the allowable limit of CD error. It is understood from FIG. 16 that the CD change occurring during exposure does not exceed CD_RoP_limit ±0.26 nm.

If a mask is given, an exemplary embodiment measures α or calculates α from physical properties of the mask. Then, the exemplary embodiment obtains f(α) based on the obtained α. Then, the exemplary embodiment estimates CD change CD_ROP and determines the polarization degree control RoP_limit for an exposure apparatus based on the estimated CD change CD_ROP.

An exemplary embodiment obtains the polarization degree control RoP_limit based on the mask structures optimized in example 2. Therefore, the requirement error in polarization degree of an exposure apparatus can be suppressed within a range of ±1%.

However, when the ratio in intensity α between the 1st-order diffraction efficiency of TE polarized light and the 1st-order diffraction efficiency of TM polarized light is less than 1, the above-described method is effective to determine the accuracy in the control of polarization degree.

Example 4

An exemplary embodiment can reduce CD change by adjusting dose when an error in polarization degree is present. To form an image of a pattern having a pitch of 74 nm and a line width L of 26 nm on a wafer with an exposure apparatus having a wavelength of ArF (193 nm) and NA=1.35, a phase shift mask having a pitch of 296 nm and a line width L of 104 nm as pattern dimensions on a 4× mask was used. In this example, the absorber (chrome) thickness was set to 103 nm, the effective light source illustrated in FIG. 2A was used, and σ=0.15 was set.

The structure 1 described in the first row of the table illustrated in FIG. 14 was used as a mask structure. More specifically, an exemplary embodiment sets an undercut (sbias (nm)) of 50, a bias (abias (nm)) of 0, an absorber thickness (t (nm)) of 73, a side wall angle (taper (deg.)) of 0, and a trench depth (d (nm)) of (180/180)λ/2(n−1). The ratio of the intensity ($I_{TE\_1}$) of 1st-order diffraction efficiency of TE polarized light to the intensity ($I_{TM\_1}$) of 1st-order diffraction efficiency of TM polarized light is as follows:

$$\alpha = I_{TE\_1}/I_{TM\_1} = 1.047.$$

An exemplary embodiment determines an allowable limit of CD error CD_RoP_limit (nm) as follows:

$$CD\_RoP\_limit(nm) = 0.26$$

The allowable error limit in polarization degree RoP_limit can be approximated by a value obtained by dividing the allowable limit of CD error CD_RoP_limit (nm) by f(α).

$$RoP\_limit \approx CD\_RoP\_limit/f(\alpha) \approx 2\%$$

When an exposure apparatus has a standard error in polarization degree equivalent to ±1%, the allowable error limit in polarization degree RoP_limit (i.e., ±2%) is larger than the standard value. Therefore, no problem occurs even if exposure is performed, because CD error is within an allowable range.

Figure 18A:
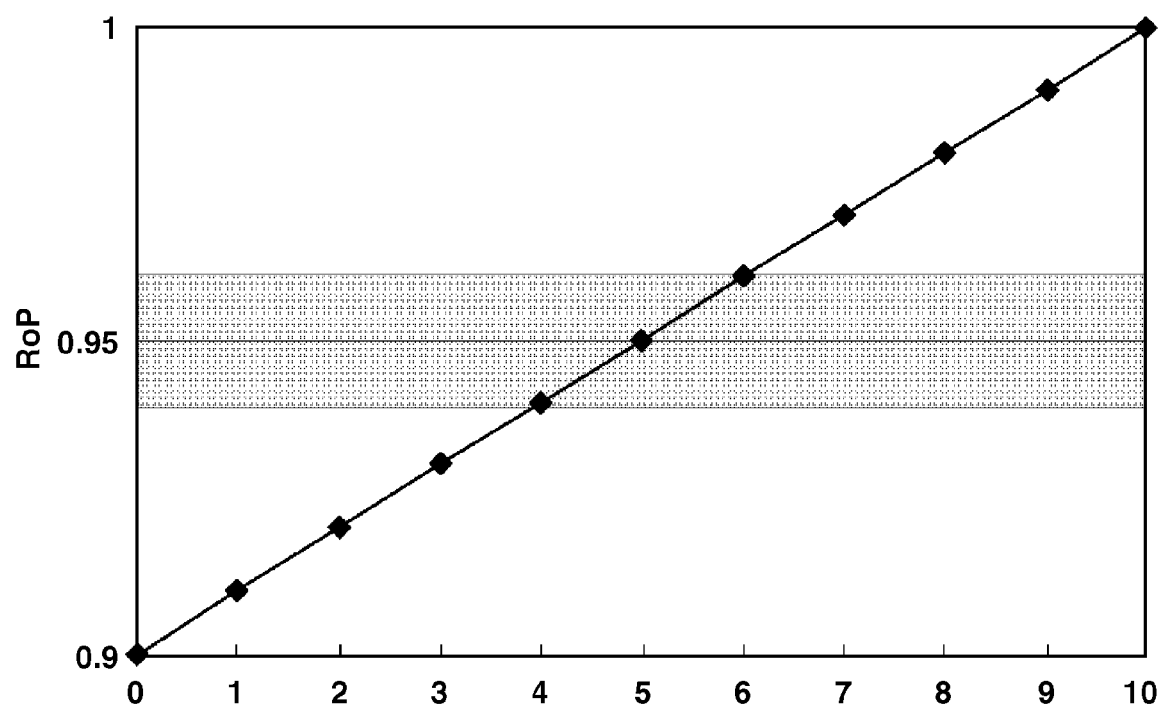
FIG. 18A illustrates example variations in polarization degree RoP.
Figure 18B:
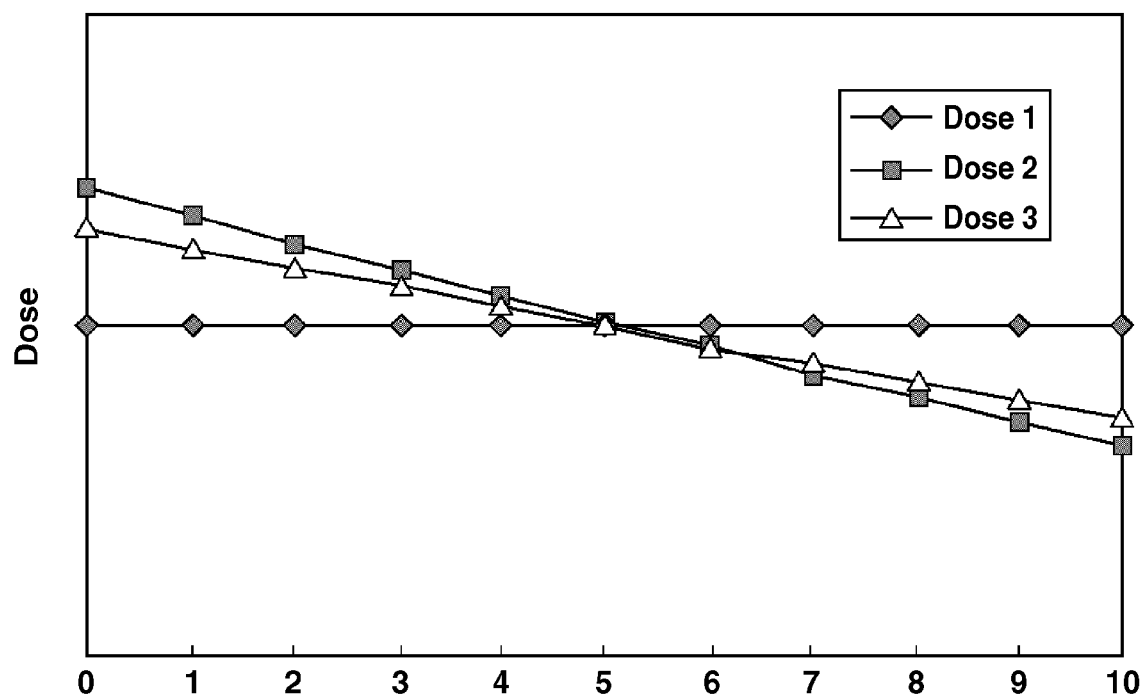
FIG. 18B illustrates example changes in the dose Dose.
Figure 18C:
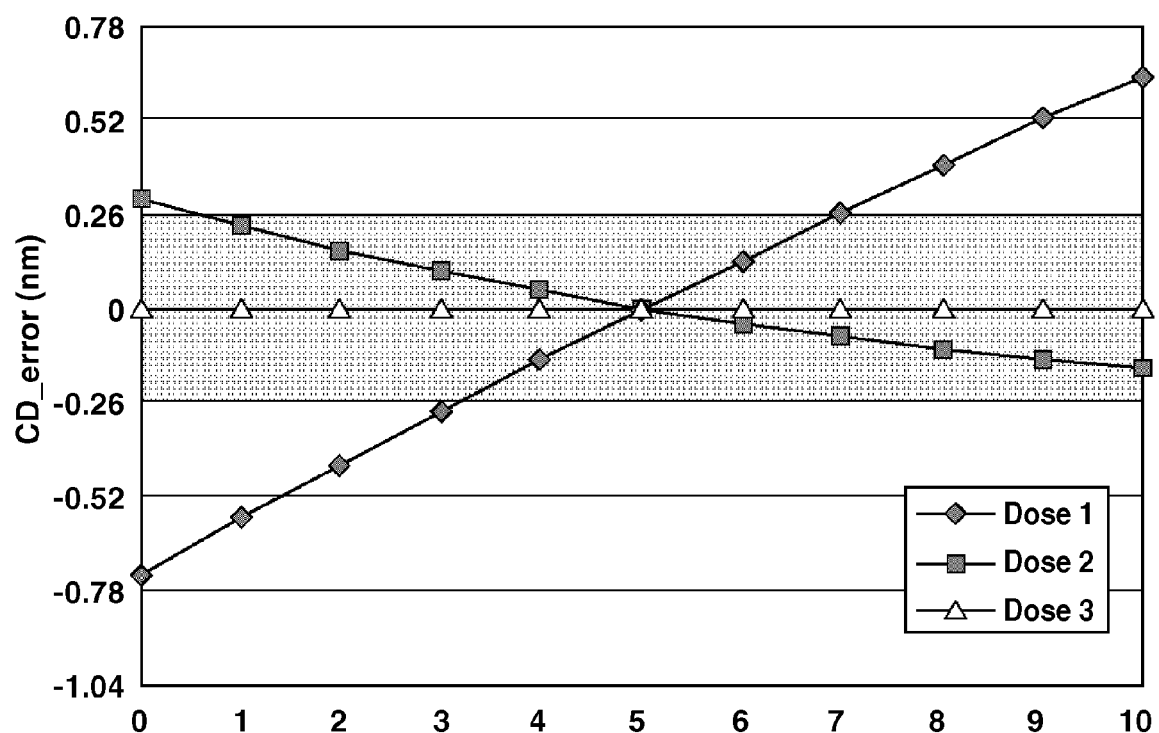
FIG. 18C illustrates example changes in CD error CD_error.

However, an exemplary embodiment intentionally increases the error in polarization degree, adjusts dose, and checks the CD change. FIG. 18A through FIG. 18C illustrate obtained results. FIG. 18A illustrates a result obtained by changing the polarization degree RoP. The polarization degree RoP may vary according to temporal changes or may vary due to device differences in individual exposure apparatuses. In FIGS. 18A, 18B, and 18C, the abscissa axis indicates elapsed time or ID number allocated to respective exposure apparatuses. FIG. 18A illustrates a result obtained by setting RoP to be a great value exceeding upper and lower limits of the standard range (gray portion) of ±1% while setting the reference polarization degree RoP to 0.95. FIG. 18B illustrates example relationships between "dose" and time or ID number allocated to respective exposure apparatuses. Dose 1 indicates dose is not changed. Dose 2 indicates dose is changed simply considering a change in polarization degree. And Dose 3 indicates dose is changed considering a change in polarization degree so as to reflect a mask structure. FIG. 18C illustrates CD errors corresponding to Dose 1, Dose 2, and Dose 3.

On the assumption that only s-polarized light can contribute to resolving a pattern, when the dose is changed simply considering a change in polarization degree, the dose D is, for example, defined by the following formula:

$$D = Do/(RoP\_measurement/RoP\_reference) = Dose2 \quad \text{(correction formula 1)}.$$

However, when the dose is changed considering a change in polarization degree so as to reflect a mask structure, the dose D can be approximated using the following first-order approximation:

$$D = Do/((RoP\_measurement + K \cdot (1 - RoP\_measurement))/(RoP\_reference + K \cdot (1 - RoP\_reference)))$$
$$= Dose3 \quad \text{(correction formula 2)}$$

In the formula, Do represents the dose of reference RoP (RoP_reference), RoP_measurement represents a measured RoP, and K represents a coefficient determined according to a mask structure.

The coefficient K is 0.26, 0.49, 0.70, 0.81, 0.44, 0.52, 0.48, 0.51, 0.68, and 0.75 for the mask structures 1 through 10. When the rate of intensity ($I_{TE\_1}$) of 1st-order diffraction efficiency of TE polarized light is large compared to the rate of intensity ($I_{TM\_1}$) of 1st-order diffraction efficiency of TM polarized light, the dose contributing to the resolution becomes larger. If the correction according to the correction formula 1 is performed, CD error becomes larger.

The coefficient K determined according to mask structure can be approximated as a function of α. As described above, α represents the ratio of the intensity ($I_{TE\_1}$) of 1st-order diffraction efficiency of TE polarized light to the intensity ($I_{TM\_1}$) of 1st-order diffraction efficiency of TM polarized light. The coefficient K can be approximated by the following formula including a process constant Kp.

$$K = Kp \cdot (0.9524\alpha - 0.708)$$

The process constant Kp is variable depending on NA of an exposure apparatus, illumination conditions (shape of effective light source, σ, distribution, reference polarization degree, etc.), a pattern, and other exposure conditions (resist, process, etc.). FIG. 18C illustrates a gray area representing a region of ±0.26 (nm) relative to the allowable limit of CD error CD_RoP_limit (nm). In the case where the dose is fixed, the allowable limit of CD error is set to the range of ±2% of the reference value of polarization degree RoP so as to correspond to FIG. 18A. In the case where the dose is changed, the allowable limit of CD error is the range of ±4% of the reference value of the polarization degree RoP.

In particularly, when α is small in a mask structure, CD error becomes larger if the dose correction is not performed. If α is large, CD error becomes larger according to the dose correction defined by the correction formula 1. However, according to the correction formula 2, the dose is changed according to a mask structure so as to reflect the change in polarization degree. Therefore, CD error becomes an extremely small value. In this manner, in response to a change in polarization degree RoP, even if a mask structure causes a large CD change, CD error can be suppressed within an allowable range by adjusting the dose according to the mask structure.

More specifically, a coefficient determined according to a mask structure can be obtained according to the above-described process conditions and the ratio α of the intensity of 1st-order diffraction efficiency of TE polarized light to the intensity of 1st-order diffraction efficiency of TM polarized light, which is determined according to the mask structure. A correction coefficient for dose corresponding to the polarization degree is variable depending on a pattern, a resist, illumination conditions, or other exposure conditions, and can be obtained beforehand based on an experiment. An exemplary embodiment performs an experiment to obtain CD changes corresponding to variations in polarization degree and CD changes corresponding to changes in dose, and obtains a rate of dose change relative to the polarization degree change to minimize the CD change.

An exemplary embodiment stores the above-described conditions into an exposure apparatus, reads a correction dose corresponding to a change in polarization degree from a memory, and determines a correction dose based on calculations. The exposure apparatus measures a change in polarization degree at predetermined time before or during exposure processing, and adjusts the dose according to the correction amount in response to a change in polarization degree. The method discussed in Japanese Patent Application Laid-Open No. 2006-279017 (U.S. Patent Application Publication No. 2006/0210911) can be used for the measurement of the polarization degree. A general method can be used for the control of dose.

As described above, even if the polarization degree changes, or even if the mask structure causes a large CD change, an exemplary embodiment can suppress CD error within an allowable range. For example, an exemplary embodiment provides a phase shift mask having small CD error sensitivity to variations in polarization state.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-188663 filed Jul. 19, 2007, which is hereby incorporated by reference herein in its entirety.

What is claimed is:

1. An exposure method of illuminating a mask with polarized light and projecting an image of a pattern of the mask onto a substrate so as to expose the substrate, the method comprising the steps of:
    calculating a dose for exposing the substrate based on information about a difference between a polarization degree of the polarized light and a references polarization degree and a ratio of the intensity of first-order diffraction efficiency of TE polarized light to the intensity of first-order diffraction efficiency of TM polarized light from the pattern of the mask; and
    exposing the substrate with the calculated dose.

2. The exposure method according to claim 1, wherein the calculating step includes the steps of:
    obtaining information indicating a change in line width of a pattern that can be formed on the substrate in relation to a change in polarization degree of a light incident on the mask based on the information about a ratio of the intensity of first-order diffraction efficiency of TE polarized light to the intensity of first-order diffraction efficiency of TM polarized light from the pattern of the mask;
    obtaining an allowable error limit in the polarization degree for exposing the substrate based on the information indicating the change in the line width and an allowable error limit in the line width when the polarization degree is larger than the allowable error limit; and
    calculating a dose for exposing the substrate based on a ratio of the intensity of first-order diffraction efficiency of TE polarized light to the intensity of first-order diffraction efficiency of TM polarized light from the pattern of the mask.

3. The exposure method according to claim 2, wherein the information indicating a change in the line width is a function of ratio of the intensity of first-order diffraction light of TE polarized light to the intensity of first-order diffraction light of TM polarized light among diffraction lights from the mask.

4. The exposure method according to claim 2, wherein when D represents the dose, the dose D can be calculated with the following formula:

$$D=Do/((RoP\_\text{measurement}+K\cdot(1-RoP\_\text{measurement}))/(RoP\_\text{reference}+K\cdot(1-RoP\_\text{reference}))),$$

where RoP_reference represents a reference value of the polarization degree of the light incident on the mask, RoP_measurement represents a measured value of the polarization degree, Do represents a dose for exposing the substrate when the polarization degree is the reference value, and K represents a coefficient determined according to the three-dimensional structure of the mask.

5. The exposure method according to claim 4, wherein the coefficient K can be expressed as follows: $K=Kp\cdot g(\alpha)$, where Kp represents a process constant, and $g(\alpha)$ represents a function of the ratio α of the intensity of first-order diffraction light of TE polarized light to the intensity of first-order diffraction light of TM polarized light among diffraction lights from the mask.

6. An exposure method of illuminating a mask with polarized light and projecting an image of a pattern of the mask onto a substrate so as to expose the substrate, the method comprising the steps of:
    calculating a dose for exposing the substrate based on information about a difference between a polarization degree of the polarized light and a references polarization degree and a three-dimensional structure of the pattern of the mask; and
    exposing the substrate with the calculated dose,
    wherein the calculating step includes the steps of:
    obtaining information indicating a change in line width of a pattern that can be formed on the substrate in relation to a change in polarization degree of a light incident on the mask based on the information about the three-dimensional structure of the pattern of the mask;

obtaining an allowable error limit in the polarization degree for exposing the substrate based on the information indicating the change in the line width and an allowable error limit in the line width and determining whether or not to expose the substrate based on the allowable error limit in the polarization degree; and calculating a dose for exposing the substrate based on the three-dimensional structure of the pattern of the mask, when it is determined not to expose the substrate in the determining step.

7. The exposure method according to claim 6, wherein the information indicating a change in the line width is a function of ratio of the intensity of first-order diffraction light of TE polarized light to the intensity of first-order diffraction light of TM polarized light among diffraction lights from the mask.

8. The exposure method according to claim 6, wherein when D represents the dose, the dose D can be calculated with the following formula:

$$D=Do/((RoP\_\text{measurement}+K\cdot(1-RoP\_\text{measurement}))/(RoP\_\text{reference}+K\cdot(1-RoP\_\text{reference}))),$$

where RoP_reference represents a reference value of the polarization degree of the light incident on the mask, RoP_measurement represents a measured value of the polarization degree, Do represents a dose for exposing the substrate when the polarization degree is the reference value, and K represents a coefficient determined according to the three-dimensional structure of the mask.

9. The exposure method according to claim 8, wherein the coefficient K can be expressed as follows: $K=Kp\cdot g(\alpha)$, where Kp represents a process constant, and $g(\alpha)$ represents a function of the ratio $\alpha$ of the intensity of first-order diffraction light of TE polarized light to the intensity of first-order diffraction light of TM polarized light among diffraction lights from the mask.

* * * * *